(12) United States Patent
Yang

(10) Patent No.: US 12,394,661 B2
(45) Date of Patent: Aug. 19, 2025

(54) SHALLOW TRENCH ISOLATION SPACERS

(71) Applicant: Micron Technology, Inc., Boise, ID (US)

(72) Inventor: Chen Yang, Shaanxi (CN)

(73) Assignee: Micron Technology, Inc., Boise, ID (US)

( * ) Notice: Subject to any disclaimer, the term of this patent is extended or adjusted under 35 U.S.C. 154(b) by 447 days.

(21) Appl. No.: 17/868,033

(22) Filed: Jul. 19, 2022

(65) Prior Publication Data

US 2024/0030058 A1 Jan. 25, 2024

(51) Int. Cl.
*H10D 84/01* (2025.01)
*H01L 21/28* (2025.01)
*H01L 21/762* (2006.01)
*H10D 84/03* (2025.01)
*H10D 84/83* (2025.01)

(52) U.S. Cl.
CPC .............................. *H01L 21/76224* (2013.01)

(58) Field of Classification Search
CPC ............ H10D 84/0151; H10D 84/0188; H01L 21/762–76237
See application file for complete search history.

(56) References Cited

U.S. PATENT DOCUMENTS

| | | | | | |
|---|---|---|---|---|---|
| 6,114,217 | A | * | 9/2000 | Park | H01L 21/76224 257/E21.546 |
| 6,555,442 | B1 | * | 4/2003 | Pai | H01L 21/76235 438/424 |
| 7,061,075 | B1 | * | 6/2006 | Babcock | H01L 21/76224 257/E21.549 |
| 2006/0043455 | A1 | * | 3/2006 | Batra | H01L 21/76229 257/314 |
| 2008/0020544 | A1 | * | 1/2008 | Lee | H10B 41/49 257/E21.679 |

* cited by examiner

*Primary Examiner* — Sonya McCall-Shepard
(74) *Attorney, Agent, or Firm* — Holland & Hart LLP

(57) ABSTRACT

Methods, systems, and devices for shallow trench isolation spacers are described. In some examples, shallow trenches may be formed in a silicon wafer and one or more dielectric materials may be formed in the trenches. A portion of the dielectric material may subsequently be removed (e.g., etched) and a spacer material may be formed in the trenches. In some examples, portions of the spacer material may be removed (e.g., etched) and the trenches may be filled with the dielectric material. The resulting trench may include one or more spacers that isolate the dielectric material from a gate oxide or other materials formed above the silicon wafer.

21 Claims, 24 Drawing Sheets

SHALLOW TRENCH ISOLATION SPACERS

FIELD OF TECHNOLOGY

The following relates to one or more systems for memory, including shallow trench isolation spacers.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

During the fabrication process of some integrated circuits, trenches may be formed to prevent current leakage between adjacent semiconductor components. For example, during a shallow trench isolation (STI) process, trenches may be formed between regions in which transistors will subsequently be formed. The STI process may include etching a pattern of trenches in a silicon wafer, forming one or more dielectric materials within the trenches, and forming a gate oxide above the wafer. In some instances, an etching process may be performed after forming the gate oxide to remove portions of the gate oxide or other materials formed above the silicon wafer. The etching process may inadvertently remove portions of the dielectric material thus forming one or more "divots" in the dielectric material filling the trench. Such divots may result in unwanted breakdown in various regions of the transistor formed from the gate region, and thus it may be desirable to form trenches that do not include divots.

Methods and corresponding apparatuses for forming trenches having one or more spacers to mitigate the formation of divots are described herein. In some examples, trenches may be formed in a silicon wafer and one or more dielectric materials may subsequently be formed in the trenches. A portion of the dielectric material may subsequently be removed (e.g., etched) and a spacer material may be formed in the trenches. In some examples, portions of the spacer material may be removed (e.g., etched) and the trenches may be filled with the dielectric material. The resulting trench may include one or more spacers that isolate the dielectric material from a gate oxide or other materials formed above the silicon wafer. Accordingly, when the gate oxide or other materials above the wafer are removed (e.g., etched), the spacers may prevent the dielectric material from being etched. That is, the presence of the spacer(s) may prevent the formation of divots in the shallow trenches, thus mitigating a potential cause of breakdown in the transistor including the gate region.

Figure 1:
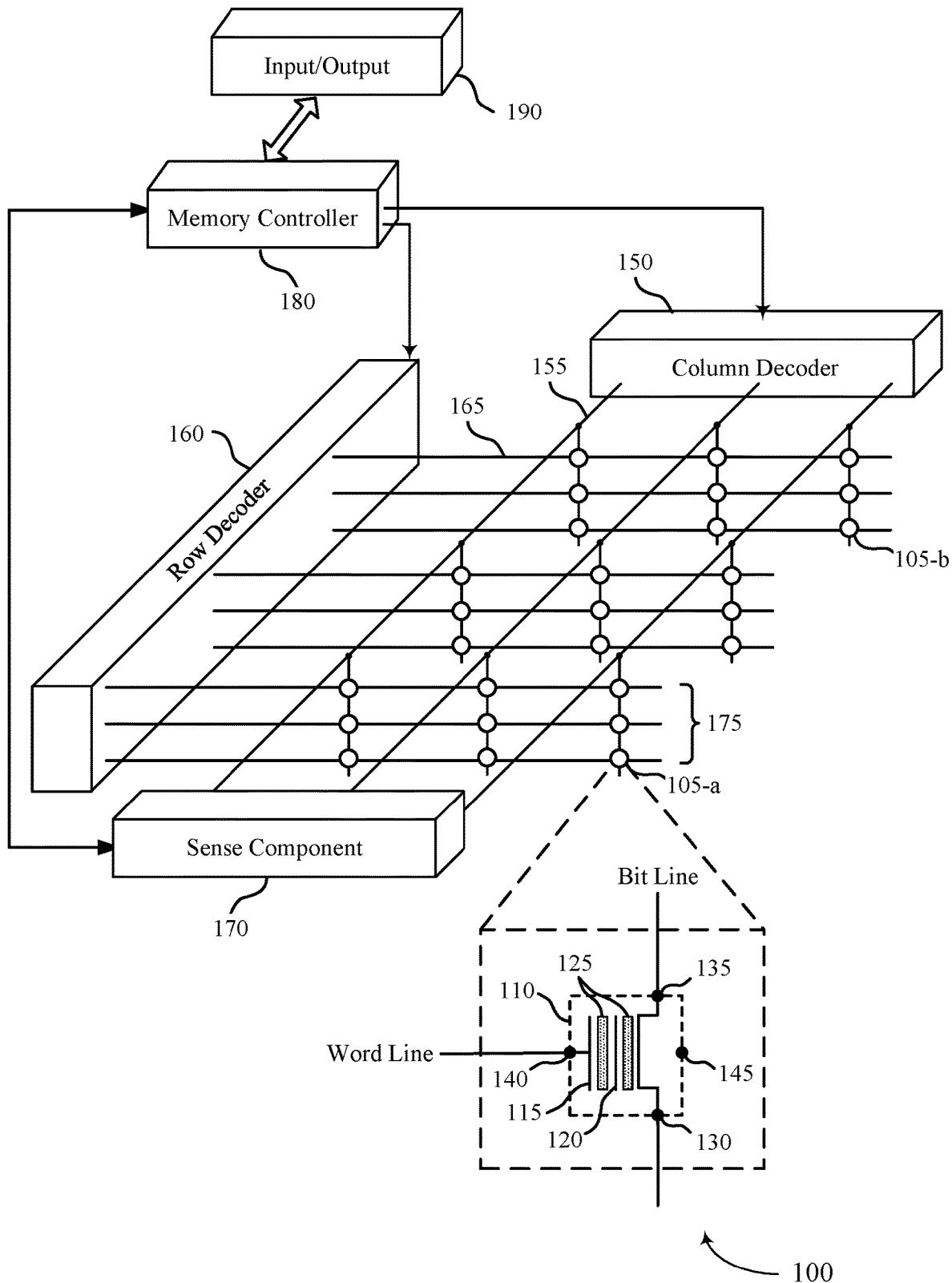
FIG. 1 illustrates an example of a system that supports shallow trench isolation spacers in accordance with examples as disclosed herein.
Figure 2:
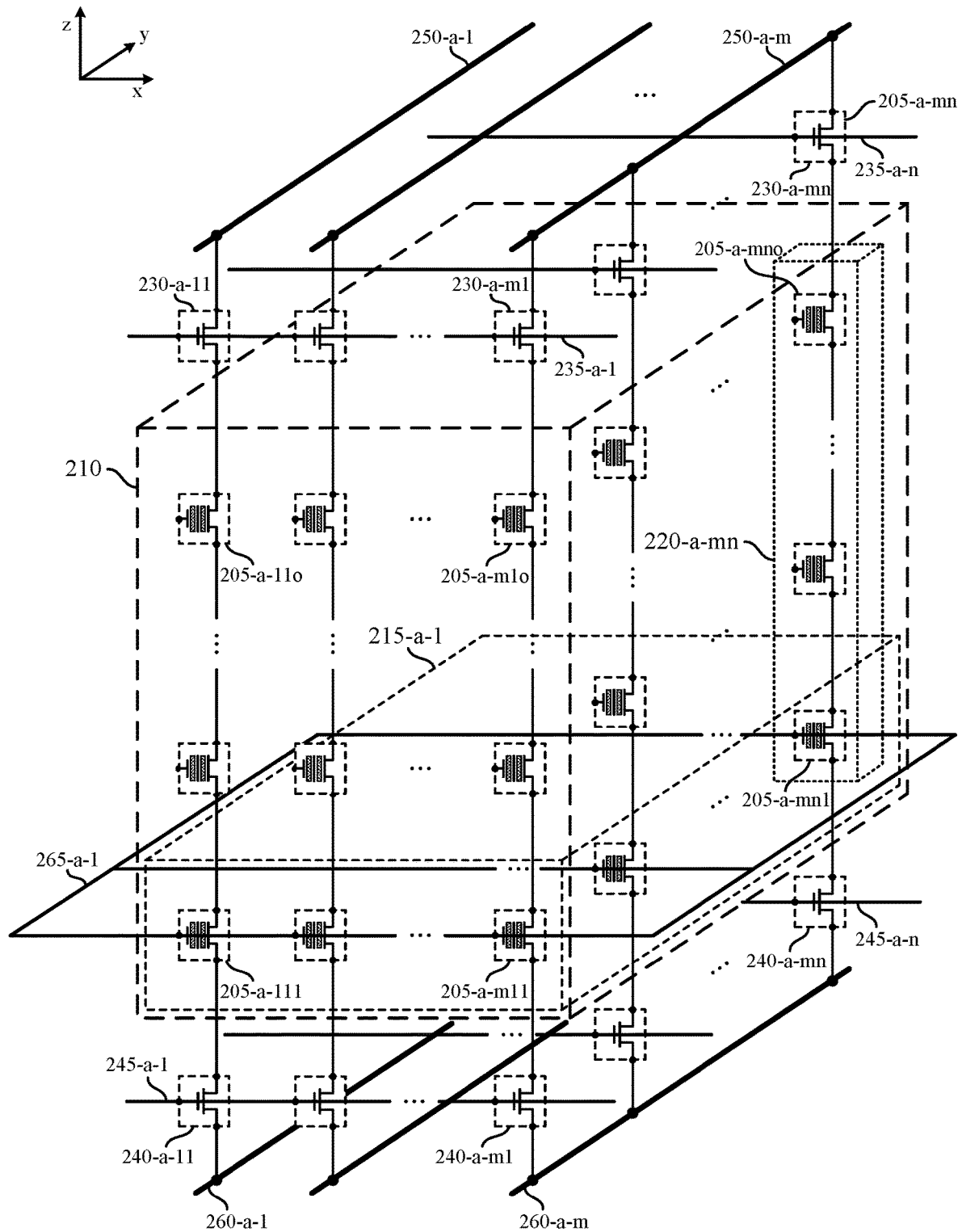
FIG. 2 illustrates an example of a memory architecture that supports shallow trench isolation spacers in accordance with examples as disclosed herein.

Features of the disclosure are initially described in the context of systems, devices, and circuits with reference to FIGS. 1 and 2. Features of the disclosure are described in the context of process flow diagrams with reference to FIGS. 3 through 22. These and other features of the disclosure are further illustrated by and described in the context of an apparatus diagram and flowchart that relate to shallow trench isolation spacers with reference to FIGS. 23 and 24.

FIG. 1 illustrates an example of a memory device 100 that supports shallow trench isolation spacers in accordance with examples as disclosed herein. FIG. 1 is an illustrative representation of various components and features of the memory device 100. As such, the components and features of the memory device 100 are shown to illustrate functional interrelationships, and not necessarily physical positions within the memory device 100. Further, although some elements included in FIG. 1 are labeled with a numeric indicator, some other corresponding elements are not labeled, even though they are the same or would be understood to be similar, in an effort to increase visibility and clarity of the depicted features.

The memory device 100 may include one or more memory cells, such as memory cell 105-*a* and memory cell 105-*b*. In some examples, a memory cell 105 may be a NAND memory cell, such as in the blow-up diagram of memory cell 105-*a*. Each memory cell 105 may be programmed to store a logic value representing one or more bits of information. In some examples, a single memory cell 105—such as a memory cell 105 configured as a single-level cell (SLC)—may be programmed to one of two supported states and thus may store one bit of information at a time (e.g., a logic 0 or a logic 1). In some other examples, a single memory cell 105—such a memory cell 105 configured as a multi-level cell (MLC), a tri-level cell (TLC), a quad-level cell (QLC), or other type of multiple-level memory cell 105—may be programmed to one of more than two supported states and thus may store more than one bit of information at a time. In some cases, a multiple-level memory cell 105 (e.g., an MLC memory cell, a TLC memory cell, a QLC memory cell) may be physically different than an SLC cell. For example, a multiple-level memory cell 105 may use a different cell geometry or may be fabricated using different materials. In some examples, a multiple-level memory cell 105 may be physically the same or similar to an SLC cell, and other circuitry in a memory block (e.g., a controller, sense amplifiers, drivers) may be configured to operate (e.g., read and program) the memory cell as an SLC cell, or as an MLC cell, or as a TLC cell, etc.

In some NAND memory arrays, each memory cell 105 may be illustrated as a transistor that includes a charge trapping structure (e.g., a floating gate, a replacement gate, a dielectric material) for storing an amount of charge representative of a logic value. For example, the blow-up in FIG. 1 illustrates a NAND memory cell 105-a that includes a transistor 110 (e.g., a metal-oxide-semiconductor (MOS) transistor) that may be used to store a logic value. The transistor 110 may include a control gate 115 and a charge trapping structure 120 (e.g., a floating gate, a replacement gate), where the charge trapping structure 120 may, in some examples, be between two portions of dielectric material 125. The transistor 110 also may include a first node 130 (e.g., a source or drain) and a second node 135 (e.g., a drain or source). A logic value may be stored in transistor 110 by storing (e.g., writing) a quantity of electrons (e.g., an amount of charge) on the charge trapping structure 120. An amount of charge to be stored on the charge trapping structure 120 may depend on the logic value to be stored. The charge stored on the charge trapping structure 120 may affect the threshold voltage of the transistor 110, thereby affecting the amount of current that flows through the transistor 110 when the transistor 110 is activated (e.g., when a voltage is applied to the control gate 115, when the memory cell 105-a is read). In some examples, the charge trapping structure 120 may be an example of a floating gate or a replacement gate that may be part of a 2D NAND structure. For example, a 2D NAND array may include multiple control gates 115 and charge trapping structures 120 arranged around a single channel (e.g., a horizontal channel, a vertical channel, a columnar channel, a pillar channel).

A logic value stored in the transistor 110 may be sensed (e.g., as part of a read operation) by applying a voltage to the control gate 115 (e.g., to control node 140, via a word line 165) to activate the transistor 110 and measuring (e.g., detecting, sensing) an amount of current that flows through the first node 130 or the second node 135 (e.g., via a bit line 155). For example, a sense component 170 may determine whether an SLC memory cell 105 stores a logic 0 or a logic 1 in a binary manner (e.g., based on a presence or absence of a current through the memory cell 105 when a read voltage is applied to the control gate 115, based on whether the current is above or below a threshold current). For a multiple-level memory cell 105, a sense component 170 may determine a logic value stored in the memory cell 105 based on various intermediate threshold levels of current when a read voltage is applied to the control gate 115, or by applying different read voltages to the control gate and evaluating different resulting levels of current through the transistor 110, or various combinations thereof. In one example of a multiple-level architecture, a sense component 170 may determine the logic value of a TLC memory cell 105 based on eight different levels of current, or ranges of current, that define the eight potential logic values that could be stored by the TLC memory cell 105.

An SLC memory cell 105 may be written by applying one of two voltages (e.g., a voltage above a threshold or a voltage below a threshold) to memory cell 105 to store, or not store, an electric charge on the charge trapping structure 120 and thereby cause the memory cell 105 store one of two possible logic values. For example, when a first voltage is applied to the control node 140 (e.g., via a word line 165) relative to a bulk node 145 (e.g., a body node) for the transistor 110 (e.g., when the control node 140 is at a higher voltage than the bulk), electrons may tunnel into the charge trapping structure 120. Injection of electrons into the charge trapping structure 120 may be referred to as programming the memory cell 105 and may occur as part of a write operation. A programmed memory cell may, in some cases, be considered as storing a logic 0. When a second voltage is applied to the control node 140 (e.g., via the word line 165) relative to the bulk node 145 for the transistor 110 (e.g., when the control node 140 is at a lower voltage than the bulk node 145), electrons may leave the charge trapping structure 120. Removal of electrons from the charge trapping structure 120 may be referred to as erasing the memory cell 105 and may occur as part of an erase operation. An erased memory cell may, in some cases, be considered as storing a logic 1. In some cases, memory cells 105 may be programmed at a page level of granularity due to memory cells 105 of a page sharing a common word line 165, and memory cells 105 may be erased at a block level of granularity due to memory cells 105 of a block sharing commonly biased bulk nodes 145.

In contrast to writing an SLC memory cell 105, writing a multiple-level (e.g., MLC, TLC, or QLC) memory cell 105 may involve applying different voltages to the memory cell 105 (e.g., to the control node 140 or bulk node 145 thereof) at a finer level of granularity to more finely control the amount of charge stored on the charge trapping structure 120, thereby enabling a larger set of logic values to be represented. Thus, multiple-level memory cells 105 may provide greater density of storage relative to SLC memory cells 105 but may, in some cases, involve narrower read or write margins or greater complexities for supporting circuitry.

A charge-trapping NAND memory cell 105 may operate similarly to a floating-gate NAND memory cell 105 but, instead of or in addition to storing a charge on a charge trapping structure 120, a charge-trapping NAND memory cell 105 may store a charge representing a logic state in a dielectric material between the control gate 115 and a channel (e.g., between a first node 130 and a second node 135). Thus, a charge-trapping NAND memory cell 105 may include a charge trapping structure 120, or may implement charge trapping functionality in one or more portions of dielectric material 125, among other configurations.

In some examples, each page of memory cells 105 may be connected to a corresponding word line 165, and each column of memory cells 105 may be connected to a corresponding bit line 155 (e.g., digit line). Thus, one memory cell 105 may be located at the intersection of a word line 165 and a bit line 155. This intersection may be referred to as an address of a memory cell 105. In some cases, word lines 165 and bit lines 155 may be substantially perpendicular to one another, and may be generically referred to as access lines or select lines.

In some cases, a memory device 100 may include a three-dimensional (3D) memory array, where multiple two-dimensional (2D) memory arrays may be formed on top of one another. In some examples, such an arrangement may increase the quantity of memory cells 105 that may be fabricated on a single die or substrate as compared with 1D arrays, which, in turn, may reduce production costs, or increase the performance of the memory array, or both. In the example of FIG. 1, memory device 100 includes multiple levels (e.g., decks, layers, planes, tiers) of memory cells 105. The levels may, in some examples, be separated by an electrically insulating material. Each level may be aligned or positioned so that memory cells 105 may be aligned (e.g., exactly aligned, overlapping, or approximately aligned) with one another across each level, forming a memory cell stack 175. In some cases, memory cells aligned along a memory cell stack 175 may be referred to as a string of memory cells 105 (e.g., as described with reference to FIG. 2).

Accessing memory cells 105 may be controlled through a row decoder 160 and a column decoder 150. For example, the row decoder 160 may receive a row address from the memory controller 180 and activate an appropriate word line 165 based on the received row address. Similarly, the column decoder 150 may receive a column address from the memory controller 180 and activate an appropriate bit line 155. Thus, by activating one word line 165 and one bit line 155, one memory cell 105 may be accessed. Upon accessing, a memory cell 105 may be read (e.g., sensed) by sense component 170. For example, the sense component 170 may be configured to determine the stored logic value of a memory cell 105 based on a signal generated by accessing the memory cell 105. The signal may include a current, a voltage, or both a current and a voltage on the bit line 155 for the memory cell 105 and may depend on the logic value stored by the memory cell 105. The sense component 170 may include various circuitry (e.g., transistors, amplifiers) configured to detect and amplify a signal (e.g., a current or voltage) on a bit line 155. The logic value of memory cell 105 as detected by the sense component 170 may be output via input/output component 190. In some cases, a sense component 170 may be a part of a column decoder 150 or a row decoder 160, or a sense component 170 may otherwise be connected to or in electronic communication with a column decoder 150 or a row decoder 160.

A memory cell 105 may be programmed or written by activating the relevant word line 165 and bit line 155 to enable a logic value (e.g., representing one or more bits of information) to be stored in the memory cell 105. A column decoder 150 or a row decoder 160 may accept data (e.g., from the input/output component 190) to be written to the memory cells 105. In the case of NAND memory, a memory cell 105 may be written by storing electrons in a charge trapping structure or an insulating layer.

A memory controller 180 may control the operation (e.g., read, write, re-write, refresh) of memory cells 105 through the various components (e.g., row decoder 160, column decoder 150, sense component 170). In some cases, one or more of a row decoder 160, a column decoder 150, and a sense component 170 may be co-located with a memory controller 180. A memory controller 180 may generate row and column address signals in order to activate a desired word line 165 and bit line 155. In some examples, a memory controller 180 may generate and control various voltages or currents used during the operation of memory device 100.

In some examples, the memory device 100 may include one or more STI regions. For example, the memory device 100 may include a STI region between each transistor 110 of a memory array. As described herein, when forming the STI regions, one or more dielectric materials may be formed in the trenches. A portion of the dielectric material may subsequently be removed (e.g., etched) and a spacer material may be formed in the trenches. In some examples, portions of the spacer material may be removed (e.g., etched) and the trenches may be filled with the dielectric material. The resulting trench may include one or more spacers that isolate the dielectric material from a gate oxide or other materials formed above the silicon wafer. Accordingly, when the gate oxide or other materials above the wafer are removed (e.g., etched), the spacers may prevent the dielectric material from being etched. That is, the presence of the spacer(s) may prevent the formation of divots in the dielectric material in the trenches, thus mitigating potential breakdown in a transistor formed from the gate region.

FIG. 2 illustrates an example of a memory architecture 200 that supports shallow trench isolation spacers in accordance with examples as disclosed herein. The memory architecture 200 may be an example of a portion of a memory device, such as a memory device 100. Although some elements of a set of elements (e.g., an array of elements) are included in FIG. 2, some elements may be omitted for the sake of visibility and clarity of the depicted elements. Moreover, although some elements included in FIG. 2 are labeled with reference numbers, some other corresponding elements are not labeled, though they are the same or would be understood by a person having ordinary skill in the art to be similar. Aspects of the memory architecture 200 may be described with reference to an x-direction, a y-direction, and a z-direction of the illustrated coordinate system.

The memory architecture 200 includes a three-dimensional array of memory cells 205, which may be examples of memory cells 105 described with reference to FIG. 1 (e.g., transistors 110, NAND memory cells). In some examples, the memory cells 205 may be connected in a 3D NAND configuration. For example, the memory cells 205 may be included in a block 210, which may be arranged as a 3D array of m memory cells along the x-direction, n memory cells along the y-direction, and o memory cells along the z-direction. Each memory cell 205 may be located (e.g., addressed) in accordance with an index i along the x-direction, an index j along the y-direction, and an index k along the z-direction (e.g., for locating a memory cell 205-$a$-$ijk$). A memory device 100 may include any quantity of one or more blocks 210 in accordance with examples as disclosed herein, and different blocks 210 may be adjacent along the x-direction, along the y-direction, or along the z-direction, or any combination thereof.

In the example of memory architecture 200, the block 210 may be divided into a set of pages 215 (e.g., a quantity of o pages 215) along the z-direction, including a page 215-$a$-1 associated with memory cells 205-$a$-111 through 205-$a$-$mn$1. In some examples, each reference to FIG. 1), which may be coupled with a control gate 115 of each of the memory cells 205 of the page 215. For example, page 215-$a$-1 may be associated with a word line 265-$a$-1, and other pages 215-$a$-$i$ may be associated with a different respective word line 265-$a$-$i$ (not shown). In some examples, a word line 265 in accordance with the memory architecture 200 may be implemented as planar conductor (e.g., in an xy-plane) that is coupled with each of the memory cells 205 of the page 215.

In the example of memory architecture 200, the block 210 also may be divided into a set of strings 220 (e.g., a quantity of (m×n) strings 220) in an xy-plane, including a string 220-$a$-$mn$ associated with memory cells 205-$a$-$mn$1 through 205-$a$-$mno$. In some examples, each string 220 may include a set of memory cells 205 connected in series (e.g., along the z-direction, in which a drain of one memory cell 205 in the string 220 may be coupled with a source of another memory cell 205 in the string 220). In some examples, memory cells 205 of a string 220 may be implemented along a common channel, such as a pillar channel (e.g., a columnar channel, a pillar of doped semiconductor) along the z-direction. Each memory cell 205 in a string 220 may be associated with a different word line 265, such that a quantity of word lines 265 in the memory architecture 200 may be equal to the quantity of memory cells 205 in a string 220. Accordingly, a string 220 may include memory cells 205 from multiple pages 215, and a page 215 may include memory cells 205 from multiple strings 220.

In some examples, memory cells 205 may be programmed (e.g., set to a logic 0 value) and read from at a granularity, such as the granularity of the page 215, but may not be erasable (e.g., reset to a logic 1 value) at the granularity, such as the granularity of the page 215. For example, NAND memory may instead be erasable at a different (e.g., higher) level of granularity, such as at the level of granularity the block 210. In some cases, a memory cell 205 may be erased before it may be re-programmed. Different memory devices may have different read, write, or erase characteristics.

In some examples, each string 220 of the block 210 may be coupled with a respective transistor 230 (e.g., a string select transistor, a drain select transistor) at one end of the string 220 (e.g., along the z-direction) and a respective transistor 240 (e.g., a source select transistor, a ground select transistor) at the other end of the string 220. In some examples, a drain of each transistor 230 may be coupled with a bit line 250 of a set of bit lines 250 associated with the block 210, where the bit lines 250 may be examples of bit lines 155 described with reference to FIG. 1. A gate of each transistor 230 may be coupled with a select line 235 (e.g., a string select line, a drain select line). Thus, a transistor 230 may be used to couple a string 220 with a bit line 250 based on applying a voltage to the select line 235, and thus to the gate of the transistors 230. Although illustrated as separate lines along the x-direction, in some examples, select lines 235 may be common to all the transistors 230 associated with the block 210 (e.g., a commonly biased string select node). For example, like the word lines 265 of the block 210, select lines 235 associated with the block 210 may, in some examples, be implemented as a planar conductor (e.g., in an xy-plane) that is coupled with each of the transistors 230 associated with the block 210.

In some examples, a source of each transistor 240 associated with the block 210 may be coupled with a source line 260 of a set of source lines 260 associated with the block 210. In some examples, the set of source lines 260 may be associated with a common source node (e.g., a ground node) corresponding to the block 210. A gate of each transistor 240 may be coupled with a select line 245 (e.g., a source select line, a ground select line). Thus, a transistor 240 may be used to couple a string 220 with a source line 260 based on applying a voltage to the select line 245, and thus to the gate of the transistors 240. Although illustrated as separate lines along the x-direction, in some examples, select lines 245 also may be common to all the transistors 240 associated with the block 210 (e.g., a commonly biased ground select node). For example, like the word lines 265 of the block 210, select lines 245 associated with the block 210 may, in some examples, be implemented as a planar conductor (e.g., in an xy-plane) that is coupled with each of the transistors 240 associated with the block 210.

To operate the memory architecture 200 (e.g., to perform a program operation, a read operation, or an erase operation on one or more memory cells 205 of the block 210), various voltages may be applied to one or more select lines 235 (e.g., to the gate of the transistors 230), to one or more bit lines 250 (e.g., to the drain of one or more transistors 230), to one or more word lines 265, to one or more select lines 245 (e.g., to the gate of the transistors 240), to one or more source lines 260 (e.g., to the source of the transistors 240), or to a bulk for the memory cells 205 (not shown) of the block 210. In some cases, each memory cell 205 of a block 210 may have a common bulk, the voltage of which may be controlled independently of bulks for other blocks 210.

In some cases, as part of a read operation for a memory cell 205, a positive voltage may be applied to the corresponding bit line 250 while the corresponding source line 260 may be grounded or otherwise biased at a voltage lower than the voltage applied to the bit line 250. In some examples, voltages may be concurrently applied to the select line 235 and the select line 245 that are above the threshold voltages of the transistor 230 and the transistor 240, respectively, for the memory cell 205, thereby activating the transistor 230 and transistor 240 such that a channel associated with the string 220 that includes the memory cell 205 may be electrically connected to the corresponding bit line 250 and the source line 260. A channel may be an electrical path through the memory cells 205 in the string 220 (e.g., through the sources and drains of the transistors in the memory cells 205 of the string 220) that may conduct current under some operating conditions.

In some examples, multiple word lines 265 (e.g., in some cases all word lines 265) of the block 210—except a word line 265 associated with a page 215 of the memory cell 205 to be read—may concurrently be set to a voltage (e.g., VREAD) that is higher than the threshold voltage (VT) of the memory cells 205. VREAD may cause all memory cells 205 in the unselected pages 215 be activated so that each unselected memory cell 205 in the string 220 may maintain high conductivity within the channel. In some examples, the word line 265 associated with the memory cell 205 to be read may be set to a voltage, VTarget. Where the memory cells 205 are operated as SLC memory cells, VTarget may be a voltage that is between (i) VT of a memory cell 205 in an erased state and (ii) VT of a memory cell 205 in a programmed state.

When the memory cell 205 to be read exhibits an erased VT (e.g., VTarget>VT of the memory cell 205), the memory cell 205 may turn "ON" in response to the application of VTarget to the word line 265 of the selected page 215, which may allow a current to flow in the channel of the string 220, and thus from the bit line 250 to the source line 260. When the memory cell 205 to be read exhibits a programmed VT (e.g., VTarget<VT of the selected memory cell), the memory cell 205 may remain "OFF" despite the application of VTarget to the word line 265 of the selected page 215, and thus may prevent a current from flowing in the channel of the string 220, and thus from the bit line 250 to the source line 260.

A signal on the bit line 250 for the memory cell 205 (e.g., an amount of current below or above a threshold) may be sensed (e.g., by a sense component 170 as described with reference to FIG. 1), and may indicate whether the memory cell 205 became conductive or remained non-conductive in response to the application of VTarget to the word line 265 of the selected page 215. The sensed signal thus may be indicative of whether the memory cell 205 was in an erased state (e.g., storing a logic 1) or a programmed state (e.g., storing a logic Though aspects of the example read operation above have been explained in the context of an SLC memory cell 205 for clarity, such techniques may be extended or altered and applied in the context of a multiple-level memory cell 205 (e.g., through the use of multiple values of VTarget corresponding to the different amounts of charge that may be stored in one multiple-level memory cell 205).

In some cases, as part of a program operation for a memory cell 205, charge may be added to a portion of the memory cell 205 such that current flow through the memory cell 205, and thus the corresponding string 220, may be inhibited when the memory cell 205 is later read. For example, charge may be injected into a charge trapping structure 120 as shown in memory cell 105-*a* of FIG. 1. In some cases, respective voltages may be applied to the word line 265 of the page 215 and the bulk of the memory cell 205 to be programmed such that a control gate 115 of the memory cell 205 is at a higher voltage than the bulk of the memory cell 205 (e.g., a positive voltage may be applied to the word line). Concurrently, voltages may be applied to the select line 235 and the select line 245 that are above the threshold voltages of the transistor 230 and the transistor 240, respectively, thereby activating the transistor 230 and the transistor 240, and the bit line 250 for the memory cell 205 to be programmed may be set to a relatively high voltage. This may cause an electric field such that electrons are pulled from the source of the memory cell 205 towards the drain. The electric field may also cause some of these electrons to be pulled through dielectric material 125 and thereby injected into the charge trapping structure 120 of the memory cell 205, through a process which may in some cases be referred to as tunnel injection.

In some cases, a single program operation may program some or all memory cells 205 in a page 215, as the memory cells 205 of the page 215 may all share a common word line 265 and a common bulk. For a memory cell 205 of the page 215 for which it is not desired to write a logic 0 (e.g., not desired to program the memory cell 205), the corresponding bit line 250 may be set to a relatively low voltage (e.g., ground), which may inhibit the injection of electrons into a charge trapping structure 120. Though aspects of the example program operation above have been explained in the context of an SLC memory cell 205 for clarity, such techniques may be extended and applied to the context of a multiple-level memory cell 205 (e.g., through the use of multiple programming voltages applied to the word line 265, or multiple passes or pulses of a programming voltage applied to the word line 265, corresponding to the different amounts of charge that may be stored in one multiple-level memory cell 205).

In some cases, as part of an erase operation for a memory cell 205, charge may be removed from a portion of the memory cell 205 such that current flow through the memory cell 205, and thus the corresponding string 220, may be uninhibited (e.g., allowed, at least to a greater extent) when the memory cell 205 is later read. For example, charge may be removed from a charge trapping structure 120 as shown in memory cell 105-*a* of FIG. 1. In some cases, respective voltages may be applied to the word line 265 of the page 215 and the bulk of the memory cell 205 to be erased such that a control gate 115 of the memory cell 205 is at a lower voltage than the bulk of the memory cell 205 (e.g., a positive voltage may be applied to the bulk), which may cause an electric field that pulls electrons out of the charge trapping structure 120 and into the bulk of the memory cell 205. In some cases, a single program operation may erase all memory cells 205 in a block 210, as the memory cells 205 of the block 210 may all share a common bulk.

In some cases, electron injection and removal processes associated with program and erase operations may cause stress on a memory cell 205 (e.g., on the dielectric material 125). Over time, such stress may in some cases cause one or more aspects of the memory cell 205 (e.g., the dielectric material 125) to deteriorate. For example, charge trapping structure 120 may become unable to maintain a stored charge. Such deterioration may be an example of a wearout mechanism for a memory cell 205, and for this or other reasons, some memory cells 205 may support a finite quantity of program and erase cycles.

In some examples, the memory architecture 200 may include one or more STI regions. For example, the memory architecture 200 may include a STI region between one or more transistors 230 of a logic circuit or memory array. As described herein, when forming the STI regions, one or more dielectric materials may be formed in the trenches. A portion of the dielectric material may subsequently be removed (e.g., etched) and a spacer material may be formed in the trenches. In some examples, portions of the spacer material may be removed (e.g., etched) and the trenches may be filled with the dielectric material. The resulting trench may include one or more spacers that isolate the dielectric material from a gate oxide or other materials formed above the silicon wafer. Accordingly, when the gate oxide or other materials above the wafer are removed (e.g., etched), the spacers may prevent the dielectric material from being etched. That is, the presence of the spacer(s) may prevent the formation of divots in the shallow trenches, thus mitigating potential breakdown in transistors formed using the gate region between the trenches.

Figure 3:
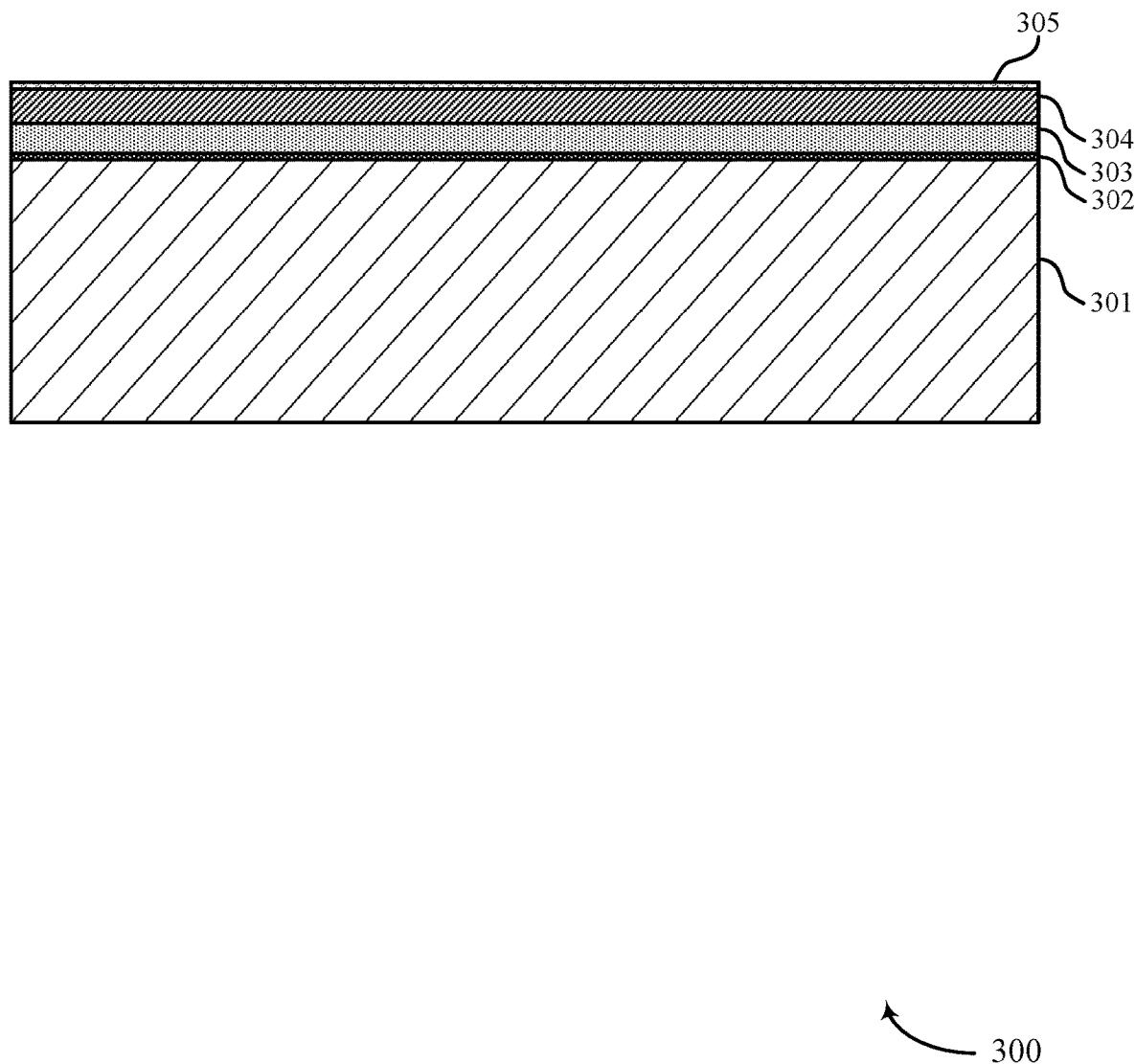
FIGS. 3-22 illustrate example process flow diagrams that support shallow trench isolation spacers in accordance with examples as disclosed herein.

FIG. 3 illustrates an example of a process flow diagram 300 that supports shallow trench isolation spacers in accordance with examples as disclosed herein. In some examples, the process flow diagram 300 may illustrate the formation of one or more materials. For example, the process flow diagram 300 may illustrate the formation of one or more materials above a substrate 301 (e.g., a silicon wafer). As described herein, forming a material may include processing steps such as depositing (vapor deposition, sputtering), etching (e.g., wet etching, dry etching, reactive ion etching, sputtering), patterning (e.g., photolithography), planarizing, oxidizing, heat treatment, other processing steps to add, remove, or change the properties of portions of the material, or combinations of these processing steps. Processing steps such as depositing or etching may be isotropic or anisotropic.

In some examples, an oxide layer 302 (e.g., a first oxide layer 302) may be formed above the substrate 301. The oxide layer 302 may be formed by oxidizing (e.g., for a duration) a top layer (e.g., a top surface) of the substrate 301. After forming the oxide layer 302, a nitride layer 303 may be formed over the oxide layer 302 (e.g., the nitride layer 303 may be deposited over an upper surface of the oxide layer 302). After forming the nitride layer 303, a carbon layer 304 may be formed over the nitride layer 303 (e.g., the carbon layer 304 may be deposited over an upper surface of the nitride layer 305).

After forming the carbon layer 304, an anti-reflection layer 305 (e.g., a dielectric anti-reflective coating (DARC) layer 305) may be formed over the carbon layer 304 (e.g., the anti-reflection layer 305 may be deposited over an upper surface of the carbon layer 304). The anti-reflection layer 305 may be formed to affect reflectivity of the stack of materials during subsequent operations (e.g., during subsequent lithography operations). Additionally or alternatively, the formation of materials described with reference to FIG. 3 may occur during any quantity of processing steps.

Figure 4:
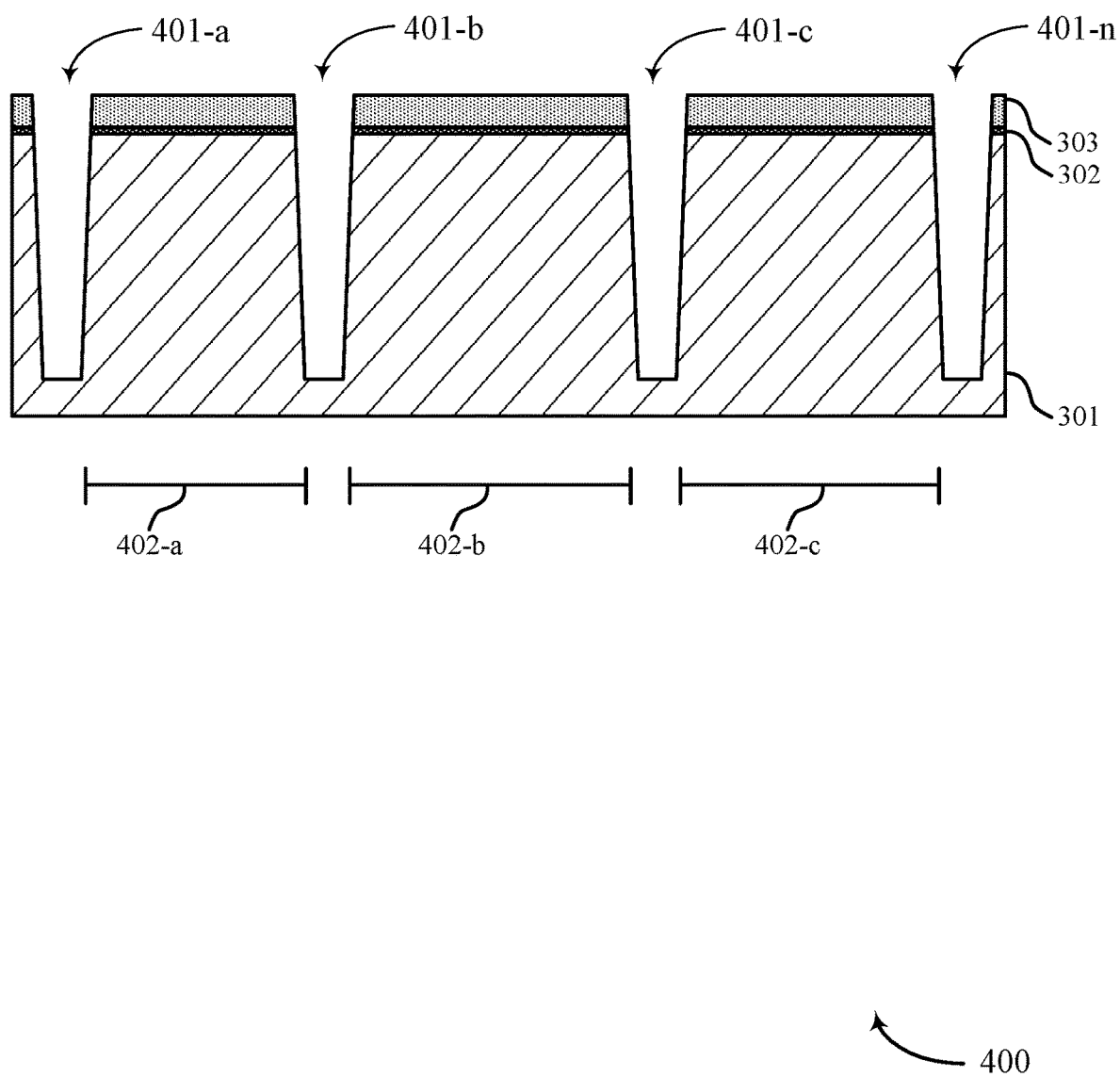

FIG. 4 illustrates an example of a process flow diagram 400 that supports shallow trench isolation spacers in accordance with examples as disclosed herein. In some examples, the process flow diagram 400 may illustrate the formation of one or more trenches 401 (e.g., shallow trenches) in one or more materials. For example, the process flow diagram 400 may illustrate the formation of one or more trenches 401 that are exhumed (e.g., etched) through the nitride layer 303, the oxide layer 302, and at least part of the substrate 301 as described with reference to FIG. 3.

In some examples (not shown), prior to the formation of the trenches 401, the anti-reflection layer 305 and the carbon layer 304 may be removed from the stack of materials. The anti-reflection layer 305 and the carbon layer 304 may be removed using one or more patterning operations (e.g., a photolithography operation), one or more etching operations (e.g., a wet etching operation or a dry etching operation), or a combination thereof.

After the removal of the anti-reflection layer 305 and the carbon layer 304, one or more trenches 401 may be formed through the nitride layer 303, the oxide layer 302, and the substrate 301. In some examples, the trenches 401 may be formed using either a wet etching operation or a dry etching operation. Additionally or alternatively, any quantity of trenches 401 may be formed. For example, n trenches may be formed through the nitride layer 303, the oxide layer 302, and the substrate 301, which may be represented by trench 401-n.

In some examples, the trenches may be located adjacent to regions of the substrate 301 that are associated with different voltage thresholds. For example, a super low voltage region 402-a may be located adjacent to the trench 401-a and the trench 401-b, a low voltage region 402-b may be located adjacent to the trench 401-b and the trench 401-c, and a super high voltage region 402-c may be located adjacent to the trench 401-c and the trench 401-n. In some examples, transistors may be formed in each of the regions 402 and may include a gate oxide having a thickness that is proportional to the region's voltage threshold (e.g., a transistor formed in the super high voltage region 402-c may have a thicker gate oxide than a transistor formed in the super low voltage region 402-a).

Figure 5:
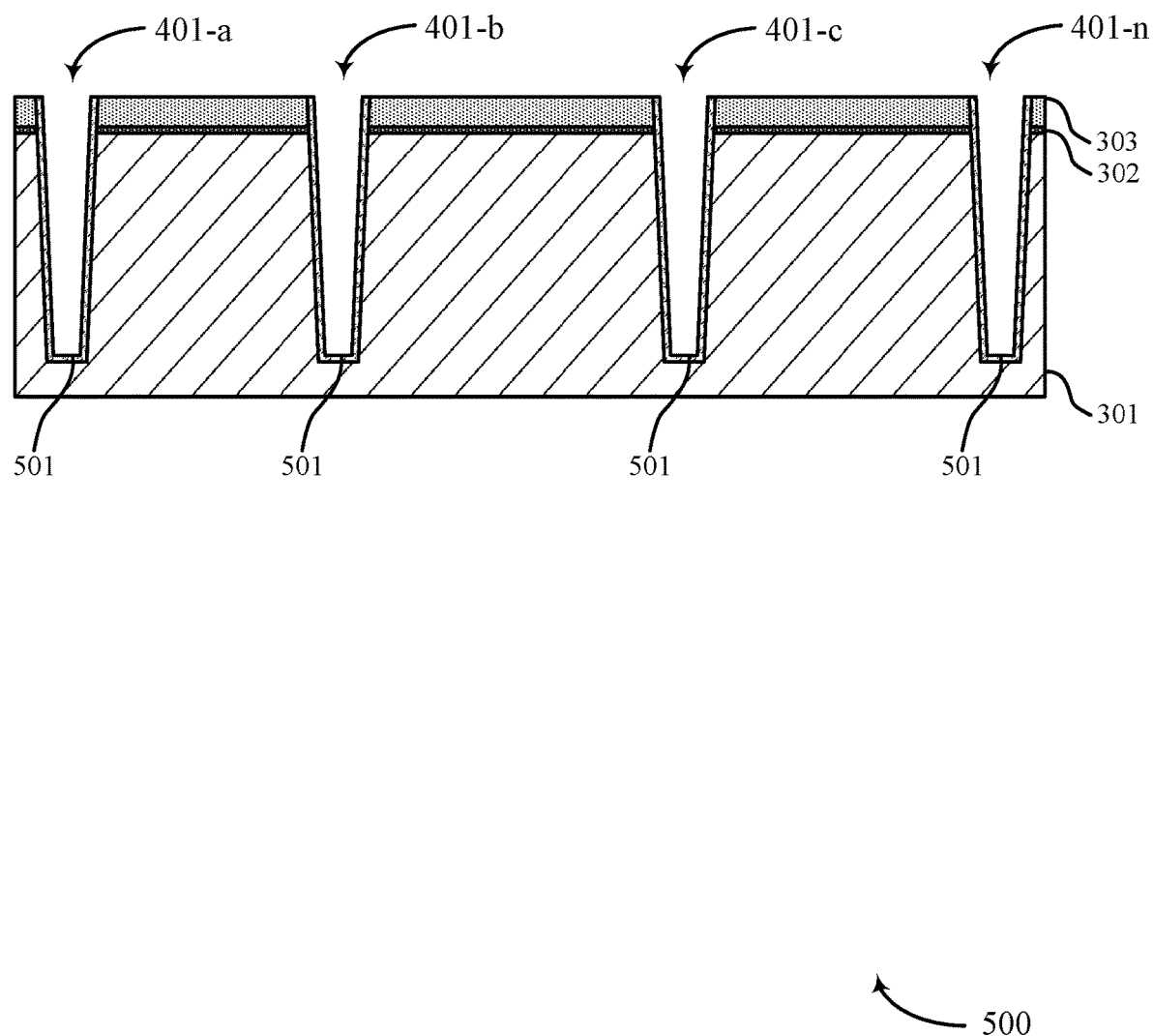

FIG. 5 illustrates an example of a process flow diagram 500 that supports shallow trench isolation spacers in accordance with examples as disclosed herein. In some examples, the process flow diagram 500 may illustrate the formation of one or more liners 501 (e.g., one or more oxide liners) in within each of the trenches 401 that are formed as described with reference to FIG. 4.

In some examples, an oxide material may be formed in each of the n trenches 401, resulting inn oxide liners 501 being formed within the respective trenches 401. For example, the oxide liners 501 may be located on the sidewalls and bottom surface of each trench 401 and may be in contact with respective portions of the substrate 301, the oxide layer 302, and the nitride layer 303.

Figure 6:
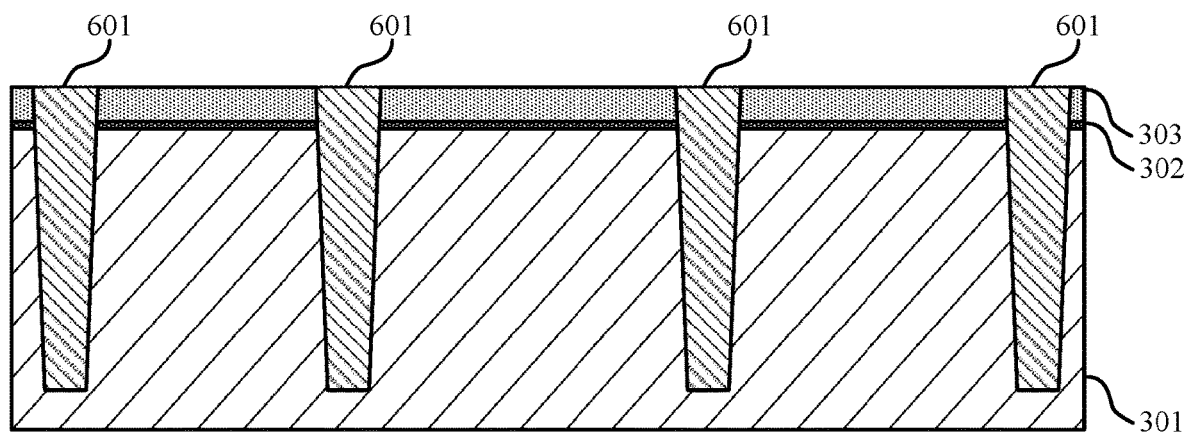

FIG. 6 illustrates an example of a process flow diagram 600 that supports shallow trench isolation spacers in accordance with examples as disclosed herein. In some examples, the process flow diagram 600 may illustrate the formation of a dielectric material 601 within each of the trenches 401 that were formed as described with reference to FIG. 4.

In some examples, the dielectric material 601 may be formed in each of the n trenches 401, resulting inn trenches 401 being filled with the dielectric material 601. For example, the dielectric material 601 may be coplanar with a top surface of the nitride layer 303. In some examples, the dielectric material 601 and the nitride layer 303 may be coplanar due to a polishing operation (e.g., a chemical-mechanical polishing (CMP) operation) being performed after the formation of the dielectric material 601. Additionally or alternatively, in some examples the formation of the dielectric material 601 may occur over the oxide liners 501. That is, oxide liners 501 may be present between the dielectric material 601 and the sides and/or bottom of the trenches. In some cases, the oxide liners 501 may be a different dielectric material than the dielectric material 601.

Figure 7:
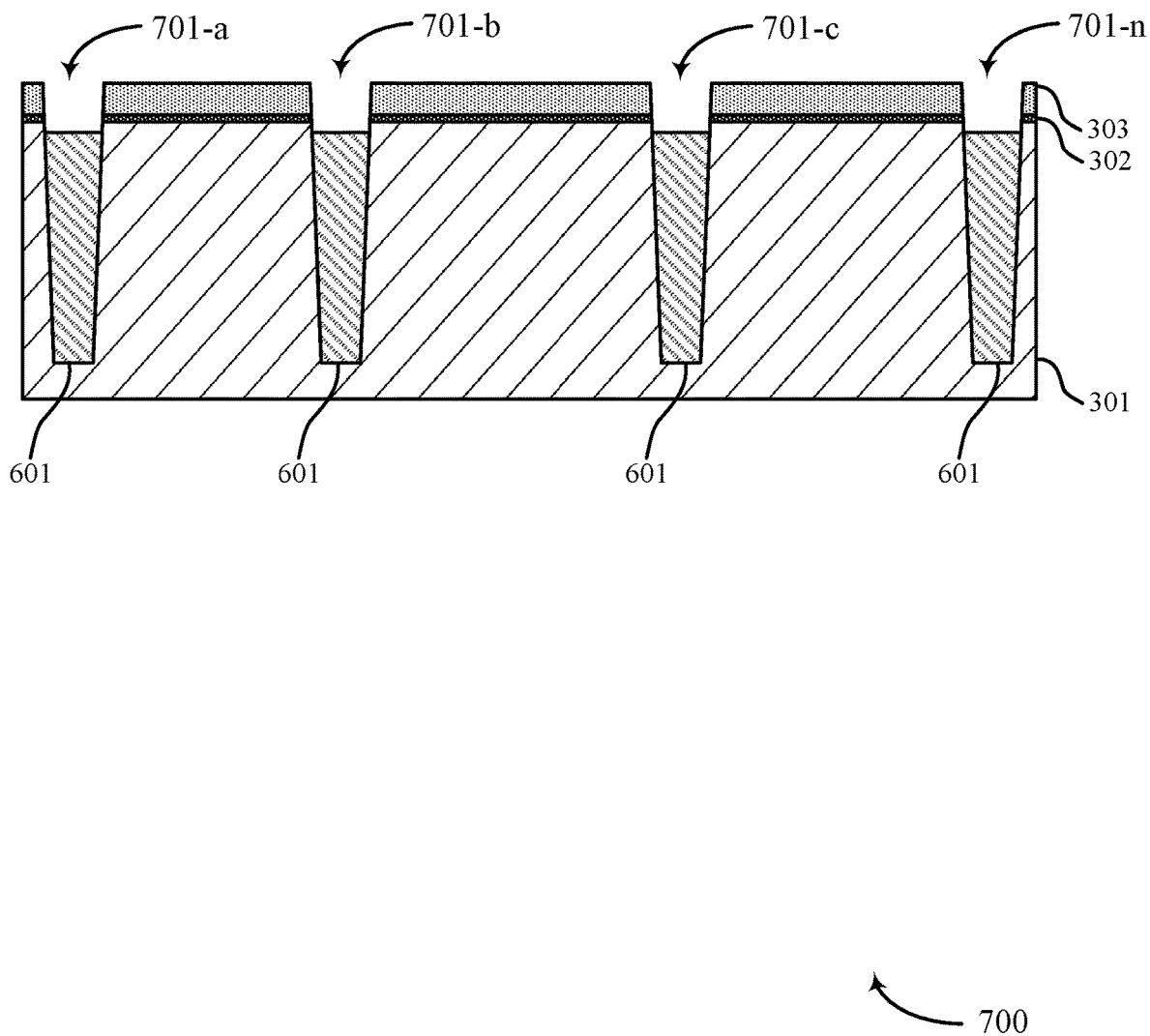

FIG. 7 illustrates an example of a process flow diagram 700 that supports shallow trench isolation spacers in accordance with examples as disclosed herein. In some examples, the process flow diagram 700 may illustrate the removal of a portion of the dielectric material 601 from each of the trenches 401 to form respective recesses 701 (e.g., recesses 701-a, 701-b, 701-c, 701-n).

In some examples, a portion of the dielectric material 601 that was formed in each of the trenches 401 may be removed. For example, an etching operation (e.g., a wet etching operation or a dry etching operation) may be performed on each formed dielectric material 601. As a result, respective recesses 701 may be formed in each trench 401. That is, the etching operation may remove a portion of the dielectric material 601 such that an upper surface of the dielectric material 601 is below an upper surface of the substrate 301. Thus, respective sidewalls of the oxide layer 302 and the nitride layer 303 may be exposed.

Figure 8:
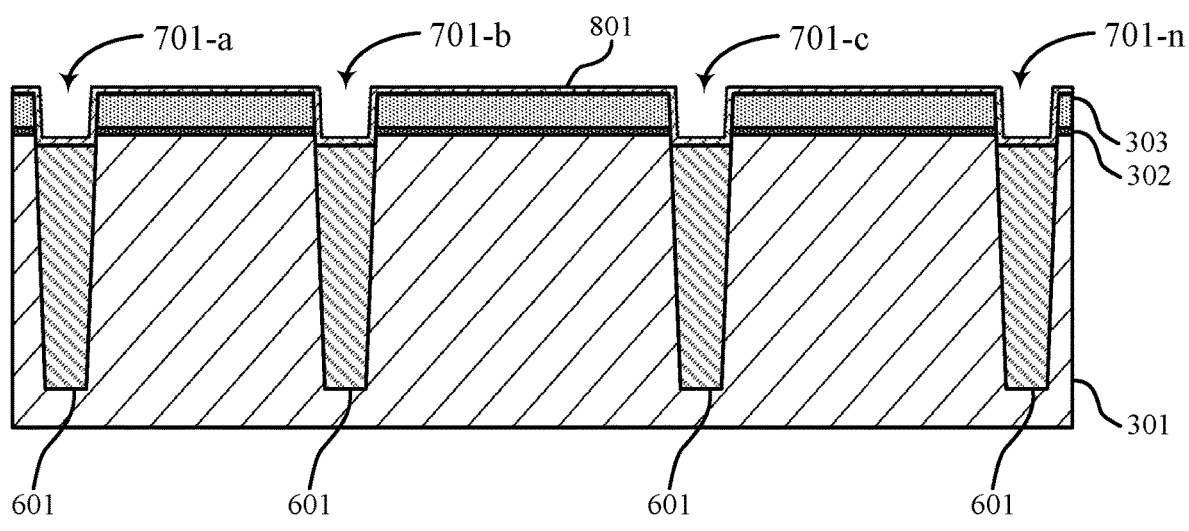

FIG. 8 illustrates an example of a process flow diagram 800 that supports shallow trench isolation spacers in accordance with examples as disclosed herein. In some examples, the process flow diagram 800 may illustrate the formation of a spacer material 801 above an upper surface of the nitride layer 303 and within each respective recess 701 that were formed as described with reference to FIG. 7.

In some examples, the spacer material 801 may be formed within each recess 701 and above an upper surface of the nitride layer 303. For example, the spacer material 801 may be formed continuously across the nitride layer 303 and within each recess 701 such that it begins above the nitride layer 303 adjacent to the recess 701-a (e.g., on a first side of the recess 701-a) and ends above the nitride layer 303 adjacent to the recess 701-n (e.g., on a second side of the recess 701-n). Additionally or alternatively, the spacer material 801 may be in contact with at least a first sidewall and a second sidewall of the nitride layer 303 within each recess 701, at least a first sidewall and a second sidewall of the oxide layer 302 within each recess 701, and an upper surface of the substrate 301 within each recess 701. In some examples, the spacer material 801 may also be in contact with at least a first sidewall and a second sidewall of the substrate 301 within each recess 701.

Figure 9:
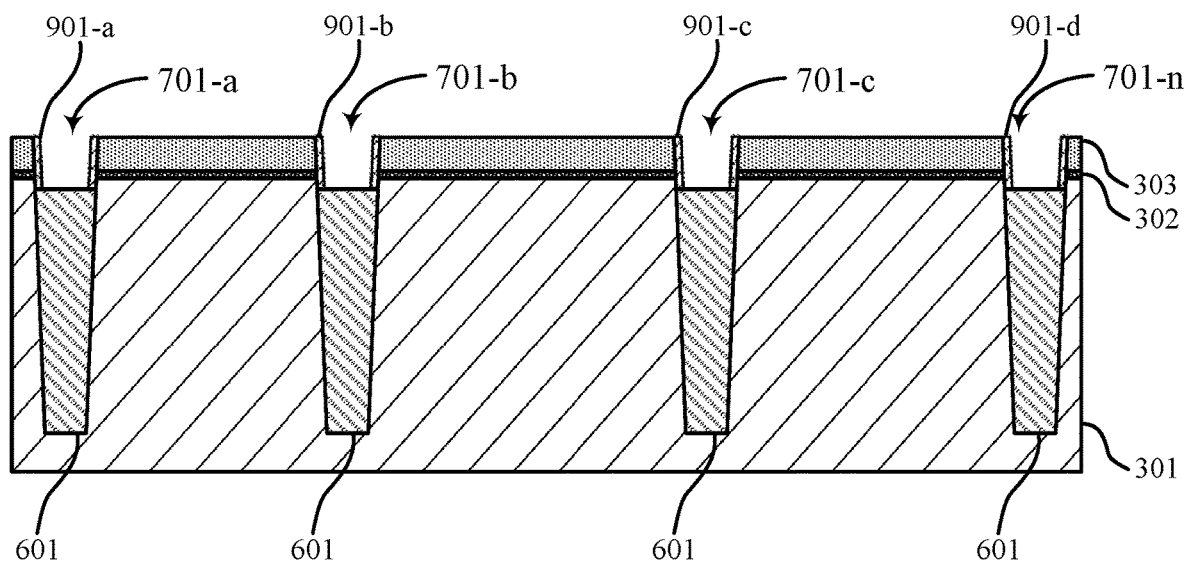

FIG. 9 illustrates an example of a process flow diagram 900 that supports shallow trench isolation spacers in accordance with examples as disclosed herein. In some examples, the process flow diagram 900 may illustrate the removal (e.g., the etching) of a portion of the spacer material 801 from within each respective recess 701 that was formed as described with reference to FIG. 7.

In some examples, a portion of the spacer material 801 that was formed in each of the recesses 701 may be removed. For example, a directional etching operation (e.g., a dry etching operation) may be performed the spacer material 801 within each recess to remove at least a portion of the spacer material 801. The etching operation may remove at least a portion of the spacer material 801 in contact with an upper surface of the substrate 301. For example, the etching operation may selectively remove the portions above the nitride layer 303 and on an upper surface of the dielectric material 601, while leaving the spacer material 801 on the sidewalls of the trenches. Accordingly, the etching operation may result in a respective spacer 901 being formed within each recess 701. The spacer 901 may be in contact with at least a first sidewall and a second sidewall of the nitride layer 303 and at least a first sidewall and a second sidewall of the oxide layer 302 at the boundary of the respective recess 701. Additionally or alternatively, the spacer 901 may also be in contact with at least a first sidewall and a second sidewall of the substrate 301 within the recess.

Figure 10:
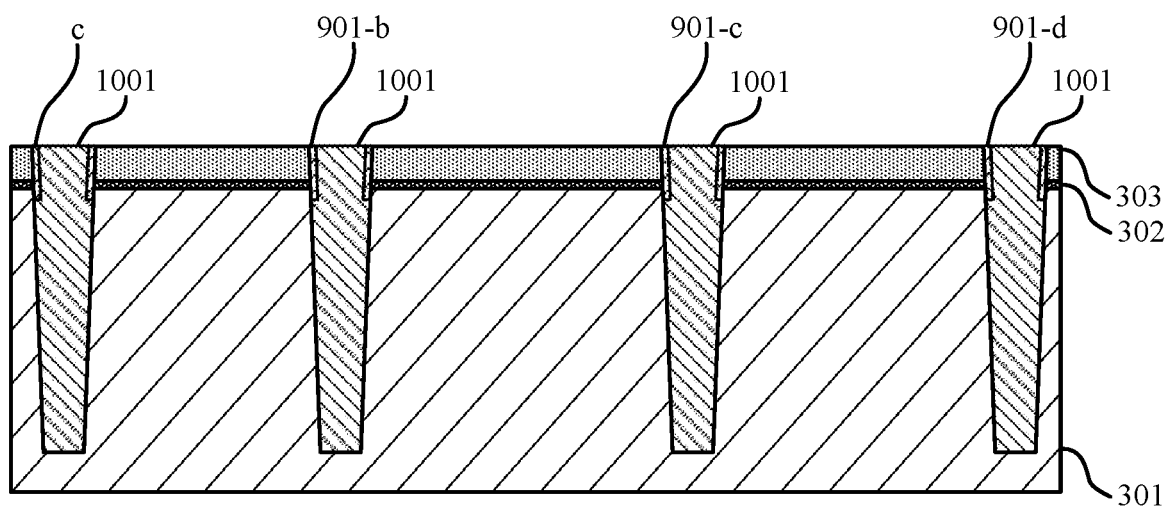

FIG. 10 illustrates an example of a process flow diagram 1000 that supports shallow trench isolation spacers in accordance with examples as disclosed herein. In some examples, the process flow diagram 1000 may illustrate the formation of a dielectric material 1001 within each of the recesses that were formed as described with reference to FIG. 7.

In some examples, the dielectric material 1001 may be formed in each of the n recesses 701, resulting inn recesses 701 being filled with the dielectric material 1001. In some examples, the dielectric material 1001 may be a same material (e.g., a same dielectric material) as the dielectric material 601 as described with reference to FIG. 6. Thus forming the dielectric material 1001 may be referred to as forming the dielectric material 601 in each of the trenches 401 for a second time.

Upon forming the dielectric material 1001 in the recesses 701, the dielectric material 1001 may be coplanar with a top surface of the nitride layer 303 and with a top surface of the spacers 901. Additionally or alternatively, the dielectric material 1001 may be in contact with at least a first sidewall and a second sidewall of the spacers 901. In some examples, the dielectric material 1001 may be coplanar with the top surface of the spacers 901 and the top surface of the nitride layer 303 due to a polishing operation (e.g., a chemical-mechanical polishing (CMP) operation) being performed after the formation of the dielectric material 1001.

Figure 11:
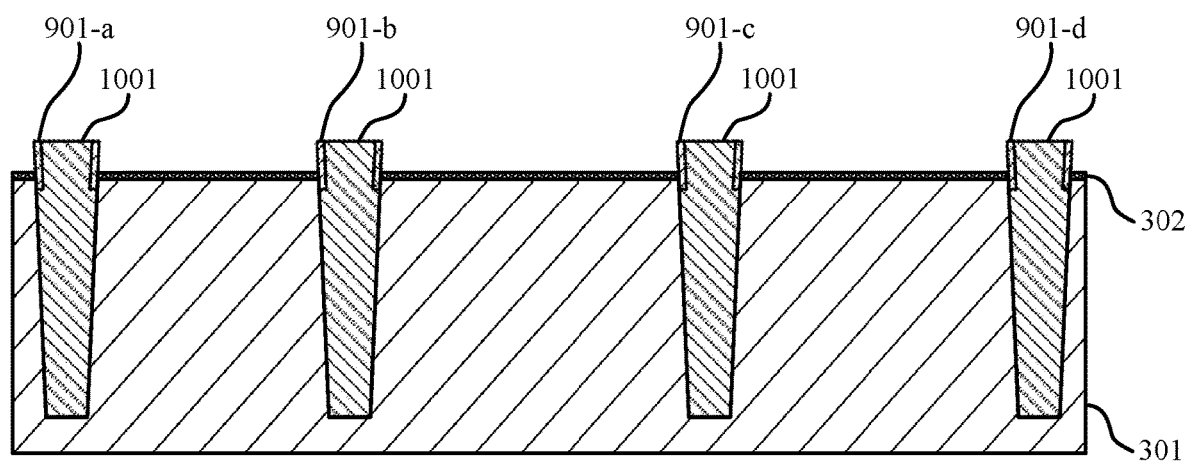

FIG. 11 illustrates an example of a process flow diagram 1100 that supports shallow trench isolation spacers in accordance with examples as disclosed herein. In some examples, the process flow diagram 1100 may illustrate the removal of the nitride layer 303. For example, the process flow diagram 1100 may illustrate the removal of the nitride layer 303 using an etching operation (e.g., a wet etching operation or a dry etching operation).

The removal of the nitride layer 303 may expose an upper surface of the oxide layer 302. Additionally or alternatively, the removal of the nitride layer 303 may expose at least a third sidewall and a fourth sidewall of each spacer 901. Moreover, an upper surface of the dielectric material 1001 may no longer be coplanar with a material due to the removal of the nitride layer 303. In some examples, the nitride layer 303 may be removed to expose the oxide layer 302 for a subsequent cleaning operation and channel implantation.

Figure 12:
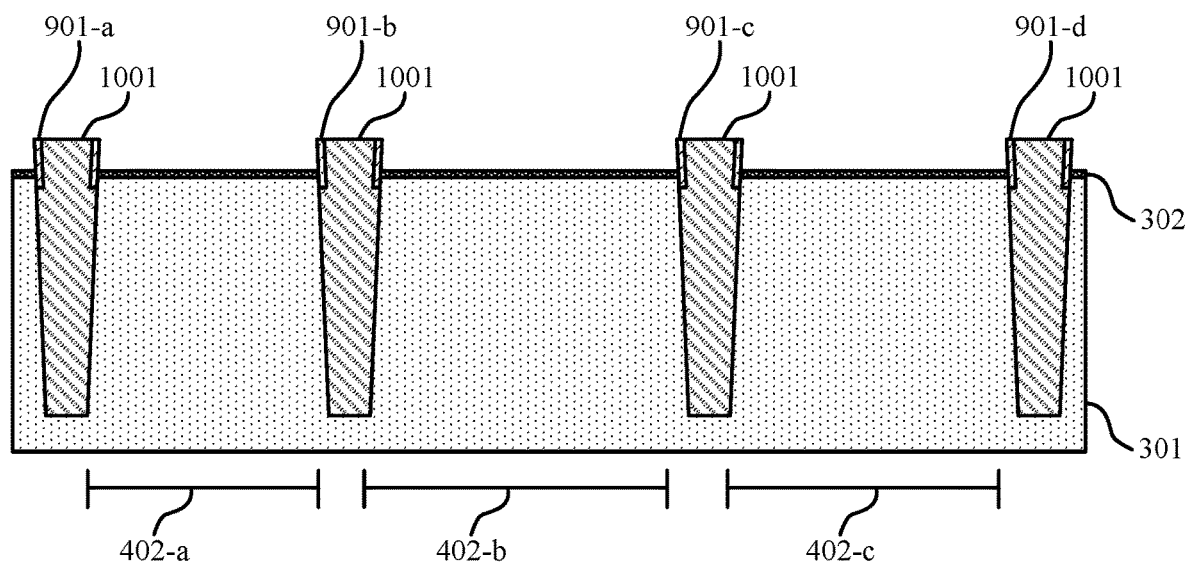

FIG. 12 illustrates an example of a process flow diagram 1200 that supports shallow trench isolation spacers in accordance with examples as disclosed herein. In some examples, the process flow diagram 1200 may illustrate the implantation of one or more gate regions within the substrate 301. In some examples, at least one channel dopant may be implanted in each of the super low voltage region 402-a, the low voltage region 402-b, and the super high voltage region 402-c. The gate regions may be implanted by implanting a dopant through the oxide layer 302. In some examples, the implanted dopant may be a p-type dopant, an n-type dopant, or a combination thereof. The implantation of one or more gate regions within the substrate may support the formation of one or more transistors in each region 402 during subsequent processing steps.

Figure 13:
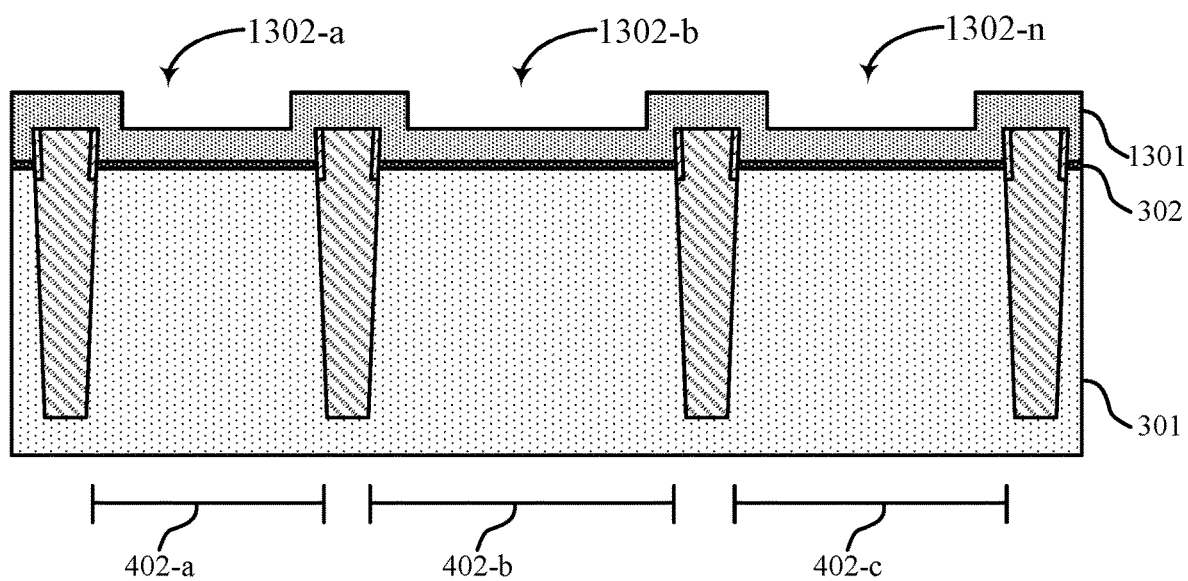

FIG. 13 illustrates an example of a process flow diagram 1300 that supports shallow trench isolation spacers in accordance with examples as disclosed herein. In some examples, the process flow diagram 1300 may illustrate the formation of one or more materials. For example, the process flow diagram 1300 may illustrate the formation of one or more materials above the oxide layer 302.

In some examples, a nitride layer 1301 may be formed over the oxide layer 302 (e.g., the nitride layer 1301 may be formed over an upper surface of the oxide layer 302). In some examples, the nitride layer 1301 may be a same material as the nitride layer 303 that was removed during a prior processing step. Additionally or alternatively, the nitride layer 1301 may be formed above an upper surface of the dielectric material 1001 and may be in contact with a third sidewall and a fourth sidewall of each spacer 901 as described with reference to FIG. 12. In some examples, after forming the nitride layer 1301, one or more recesses 1302 may naturally form in the nitride layer 1301. For example, the recesses 1302 (e.g., recesses 1302-a, 1302-b, 1302-n) may be located above a portion of each voltage region 402.

Figure 14:
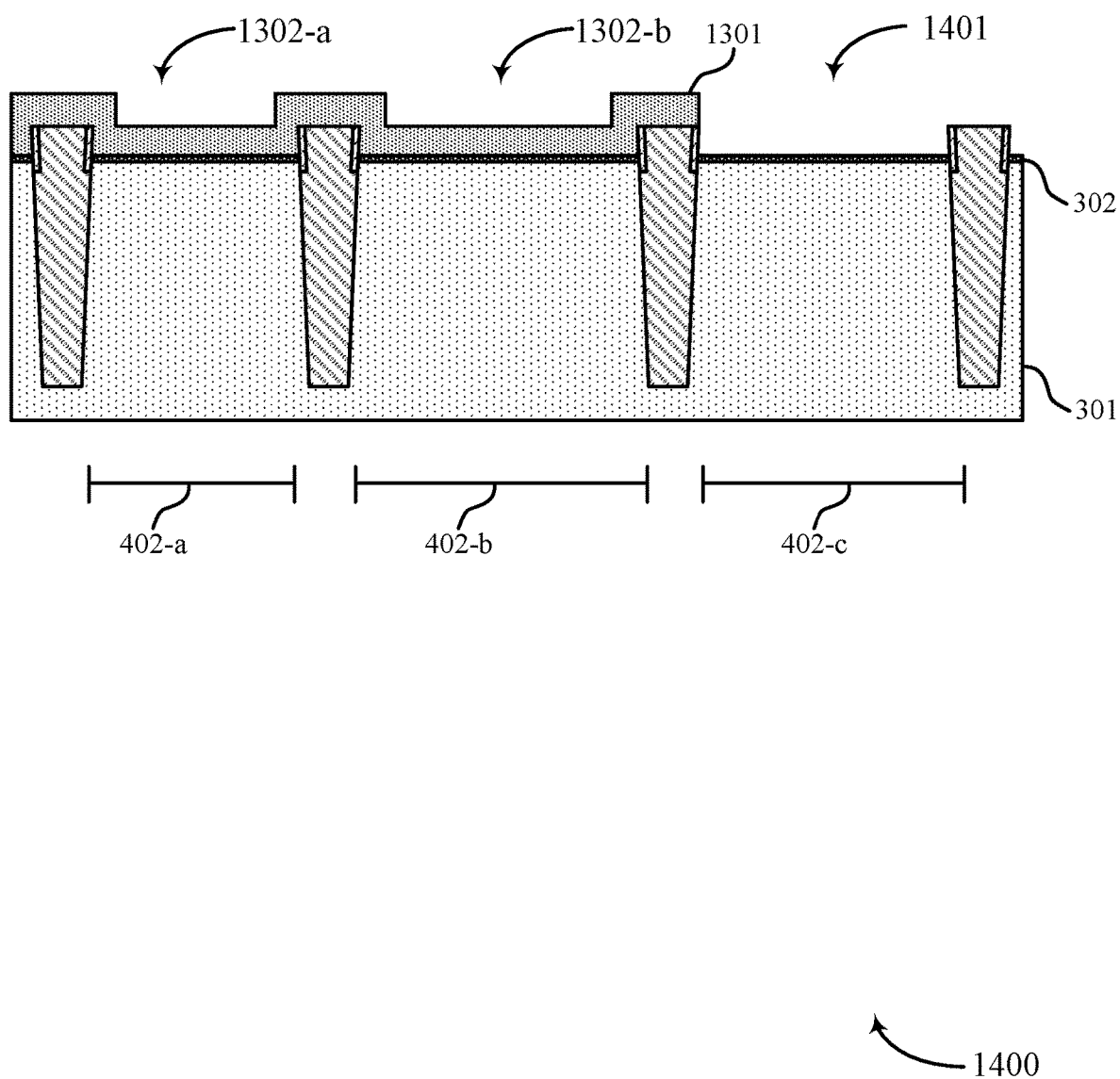

FIG. 14 illustrates an example of a process flow diagram 1400 that supports shallow trench isolation spacers in accordance with examples as disclosed herein. In some examples, the process flow diagram 1400 may illustrate the removal of a portion of the nitride layer 1301. For example, the process flow diagram 1400 may illustrate the removal of the portion of the nitride layer 1301 above the super high voltage region 402-c (e.g., shown by 1401) using an etching operation (e.g., a wet etching operation or a dry etching operation) or a cleaning operation. The removal of the portion of the oxide layer 302 above the super high voltage region 402-c may expose a portion of an upper surface of the oxide layer 302.

Figure 15:
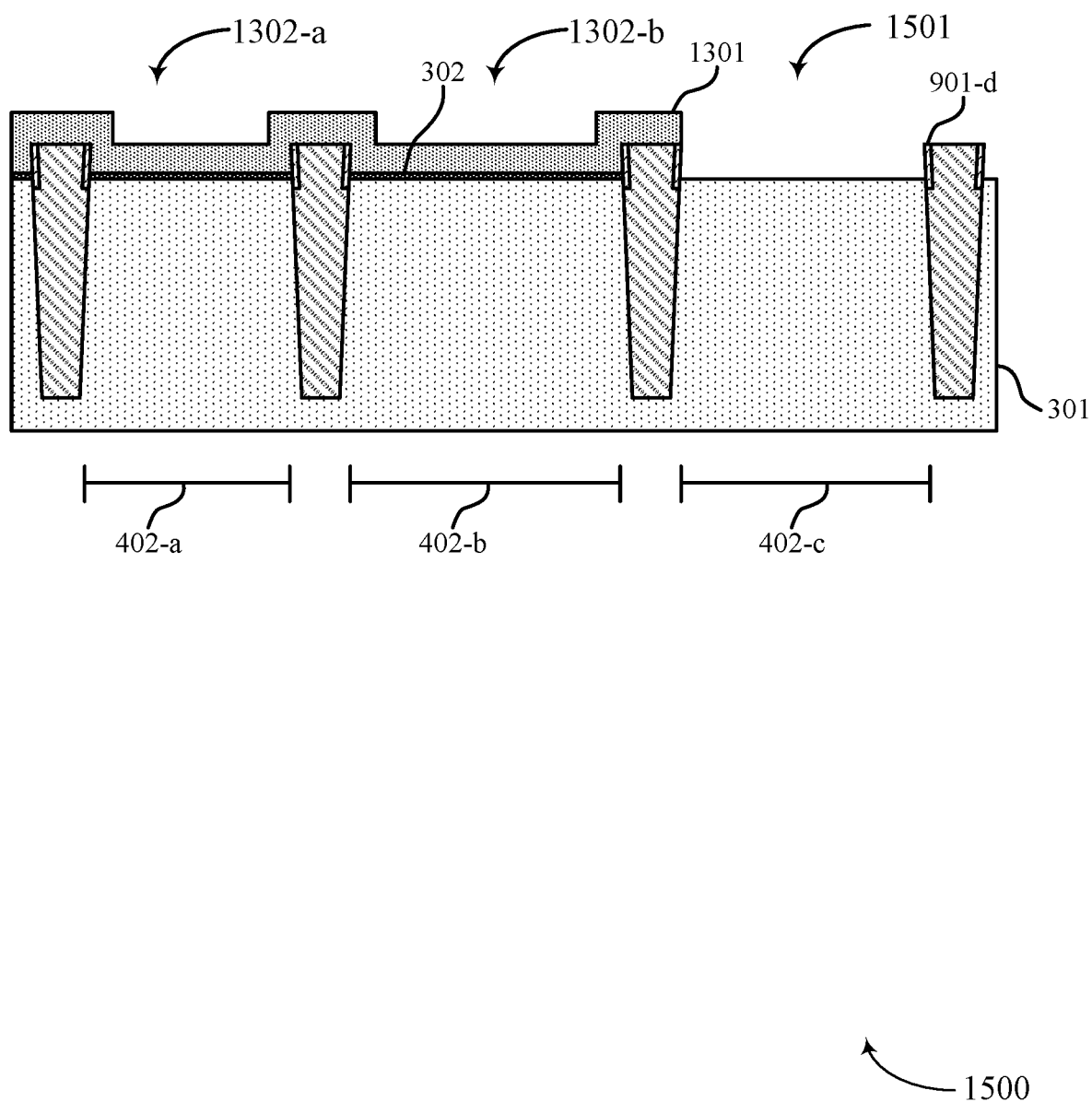

FIG. 15 illustrates an example of a process flow diagram 1500 that supports shallow trench isolation spacers in accordance with examples as disclosed herein. In some examples, the process flow diagram 1500 may illustrate the removal of a portion of the oxide layer 302. For example, the process flow diagram 1500 may illustrate the removal of the portion of the oxide layer 302 above the super high voltage region 402-c (e.g., shown by 1501) using an etching operation (e.g., a wet etching operation or a dry etching operation). The removal of the portion of the oxide layer 302 above the super high voltage region 402-c may expose a portion of an upper surface of the substrate 301. Because of the presence of the material of spacer 901-d during the removal of the oxide layer 302, which may have a low selectivity to the etch process for the oxide layer 302, the removal process may not create a divot into the material of spacer 901-d or the dielectric material 601, which is protected by the material of spacer 901-d. Thus, the material of spacer 901-d may assist in forming a transistor that comprises a gate region including region 1501 that is not susceptible to breakdown due to divot formation in the oxide in the trench region.

Figure 16:
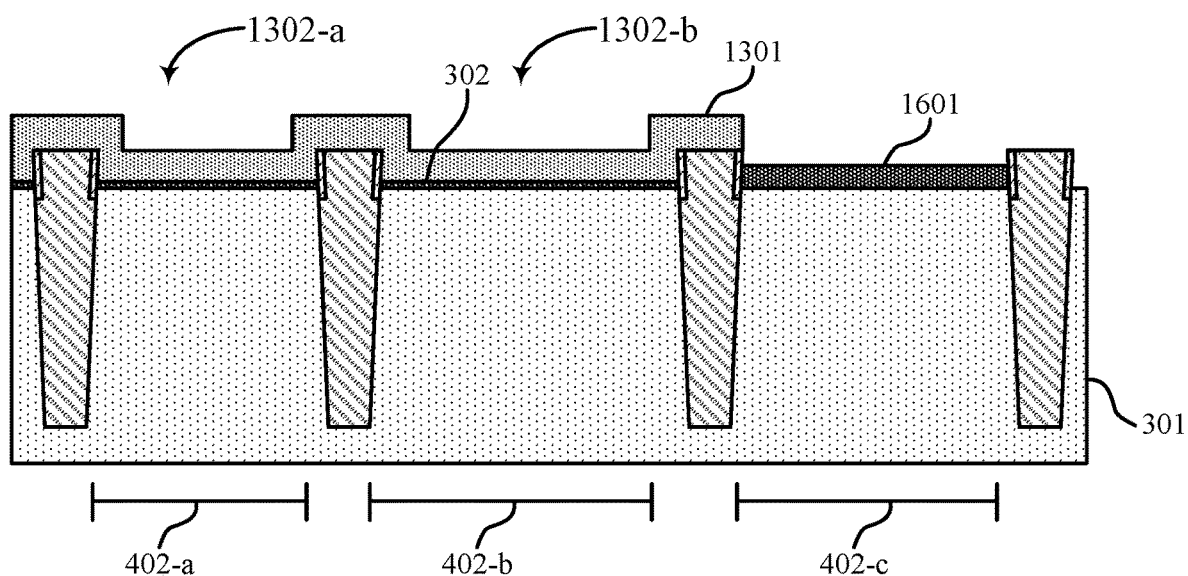

FIG. 16 illustrates an example of a process flow diagram 1600 that supports shallow trench isolation spacers in accordance with examples as disclosed herein. In some examples, the process flow diagram 1600 may illustrate the formation of one or more materials. For example, the process flow diagram 1600 may illustrate the formation of one or more materials above a portion of the substrate 301.

In some examples, an oxide layer 1601 (e.g., a first oxide layer 1601) may be formed above the super high voltage region 402-c of the substrate 301. The oxide layer 1601 may be formed by oxidizing (e.g., for a duration) a top layer (e.g., a top surface) of the substrate 301 for a duration. In some examples, the duration that the top surface of the substrate 301 is oxidized may be proportional to the thickness of the resulting gate oxide. For example, because the resulting gate oxide is associated with the super high voltage region 402-c, the top surface of the substrate 301 may be oxidized for a relatively long duration such that the resulting gate oxide is relatively thick.

Figure 17:
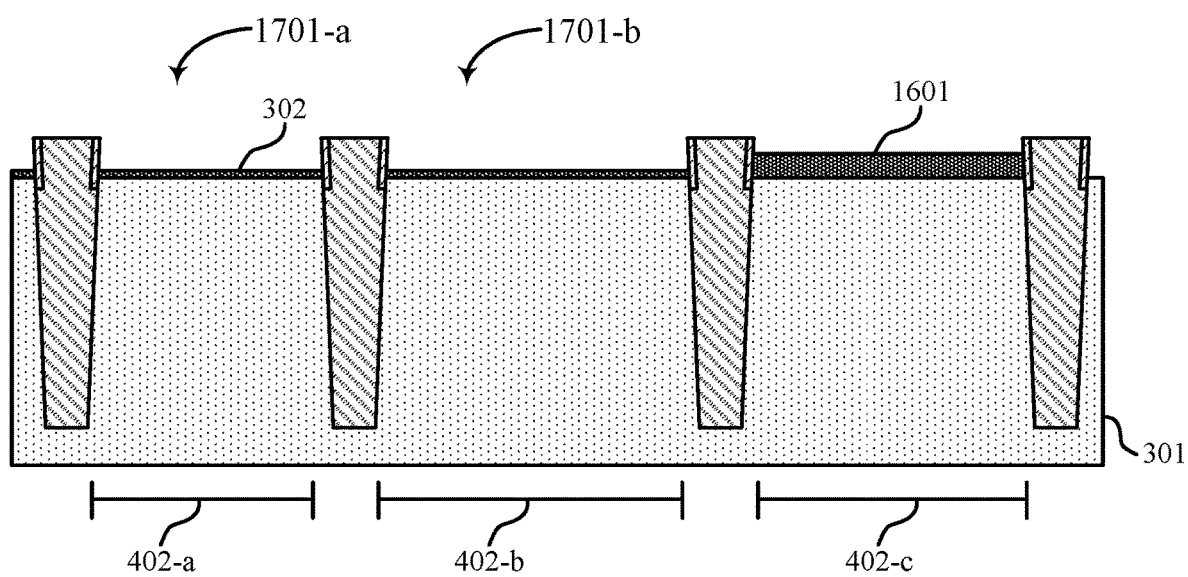

FIG. 17 illustrates an example of a process flow diagram 1700 that supports shallow trench isolation spacers in accordance with examples as disclosed herein. In some examples, the process flow diagram 1700 may illustrate the removal of the remaining portions of the nitride layer 1301. For example, the process flow diagram 1700 may illustrate the removal of the portion of the nitride layer 1301 above the super low voltage region 402-a (e.g., shown by region 1701-a) and the low voltage region 402-b (shown by region 1701-b) using an etching operation (e.g., a wet etching operation or a dry etching operation) or a cleaning operation. The removal of the portion of the oxide layer 1301 above the super low voltage region 402-a and the low voltage region 402-b may be performed during a single etching or cleaning operation and may expose a portion of an upper surface of the oxide layer 302.

Figure 18:
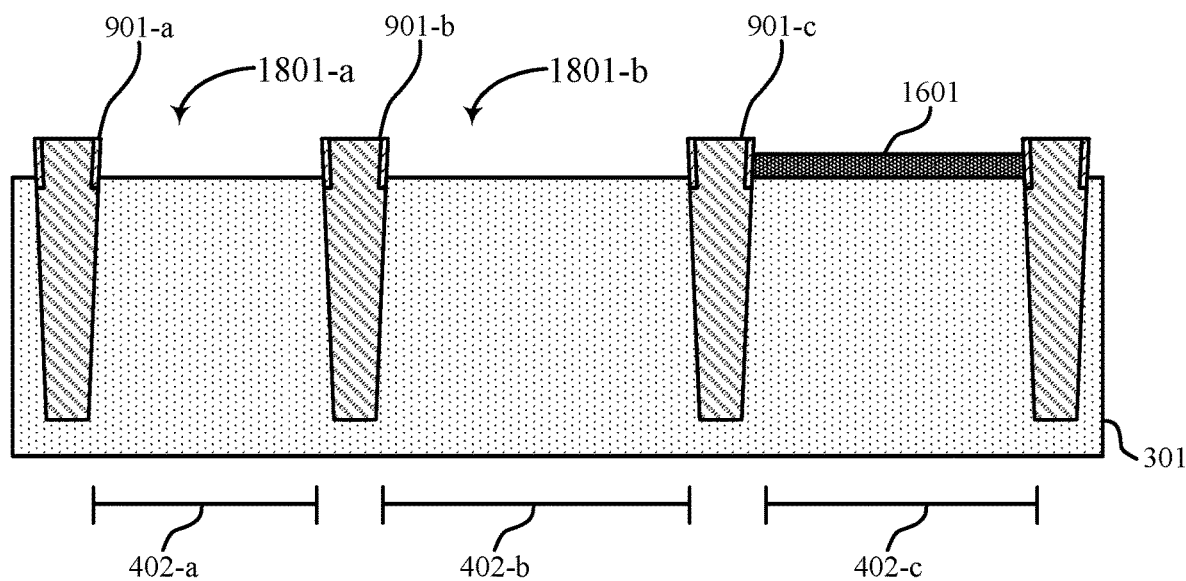

FIG. 18 illustrates an example of a process flow diagram 1800 that supports shallow trench isolation spacers in accordance with examples as disclosed herein. In some examples, the process flow diagram 1800 may illustrate the removal of a portion of the oxide layer 302. For example, the process flow diagram 1800 may illustrate the removal of the portion of the oxide layer 302 above the super low voltage region 402-a (e.g., shown by 1801-a) and above the low voltage region 402-b (e.g., shown by 1801-b) using an etching operation (e.g., a wet etching operation or a dry etching operation) or a cleaning operation. The removal of the portion of the oxide layer 302 above the super low voltage region 402-a and the low voltage region 402-b may be performed during a single etching or cleaning operation and expose a portion of an upper surface of the substrate 301. Because of the presence of the material of spacer 901 (e.g., spacer 901-a, 901-b, and 901-c) during the removal of the oxide layer 302, which may have a low selectivity to the etch process for the oxide layer 302, the removal process may not create a divot into the material of spacer 901 or the dielectric material 601, which is protected by the spacer 901. Thus, the spacer 901 may assist in forming transistors that comprise gate regions including regions 1801-a or 1801-b that are not susceptible to breakdown due to divot formation in the oxide in the trench region.

Figure 19:
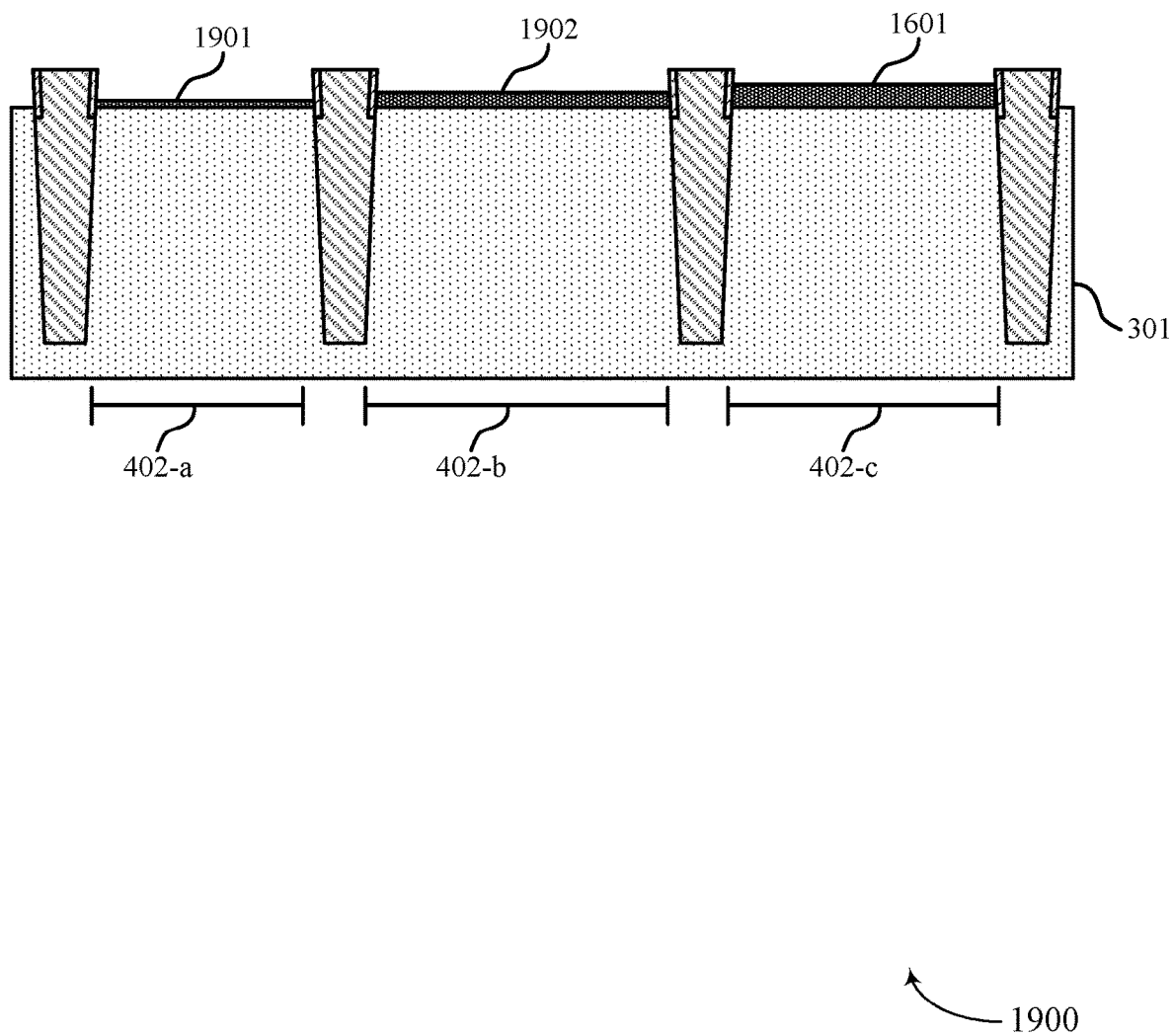

FIG. 19 illustrates an example of a process flow diagram 1900 that supports shallow trench isolation spacers in accordance with examples as disclosed herein. In some examples, the process flow diagram 1900 may illustrate the formation of one or more materials. For example, the process flow diagram 1900 may illustrate the formation of one or more materials above a portion of the substrate 301.

In some examples, an oxide layer 1902 (e.g., a second oxide layer 1902) may be formed above the low voltage region 402-b of the substrate 301 and an oxide layer 1901 (e.g., a third oxide layer 1901) may be formed above the super low voltage region 402-a of the substrate 301. The oxide layer 1902 and the oxide layer 1901 may be formed by oxidizing (e.g., for respective durations) a top layer (e.g., a top surface) of the substrate 301. In some examples, the duration that the top surface of the substrate 301 is oxidized may be proportional to the thickness of the resulting gate oxide.

For example, because the resulting gate oxide associated with the low voltage region 402-b may be less thick than the resulting gate oxide associated with the super high voltage region 402-c, the top surface of the substrate 301 above the low voltage region 402-b may be oxidized for a lesser duration than the top surface of the substrate 301 above the super high voltage region 402-c. Additionally or alternatively, because the resulting gate oxide associated with the super low voltage region 402-a may be less thick than the resulting gate oxide associated with the low voltage region 402-b, the top surface of the substrate 301 above the super low voltage region 402-a may be oxidized for a lesser duration than the top surface of the substrate 301 above the low voltage region 402-b. Additionally, the oxide layer 1601 may be partially formed during the step for forming the oxide layers 1901 and 1902, such that a first portion of oxide layer 1601 may be formed as shown in FIG. 16, and a second portion may be formed concurrently with formation of the oxide layers 1901 and 1902.

Figure 20:
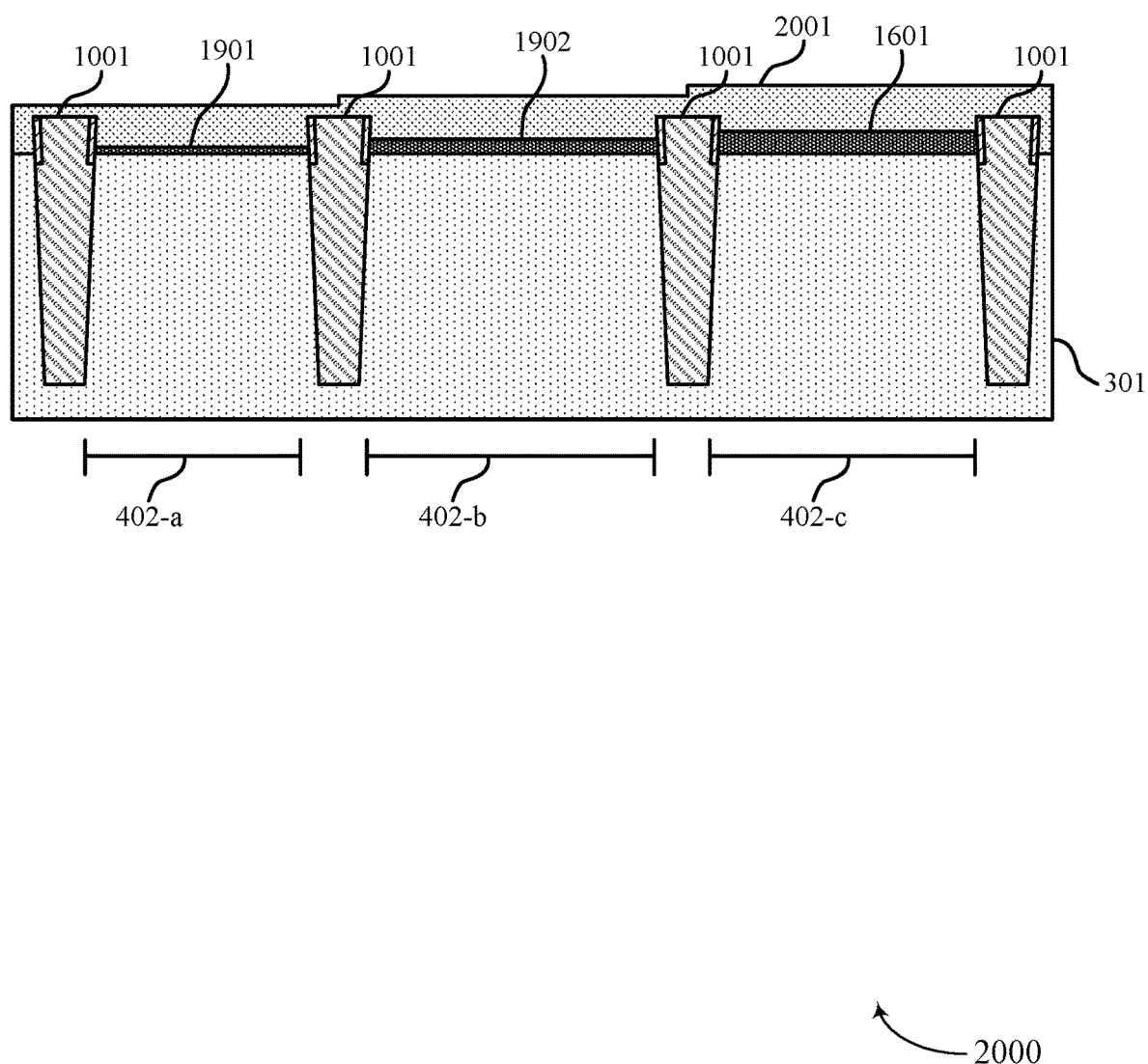

FIG. 20 illustrates an example of a process flow diagram 2000 that supports shallow trench isolation spacers in accordance with examples as disclosed herein. In some examples, the process flow diagram 2000 may illustrate the formation of one or more materials. For example, the process flow diagram 2000 may illustrate the formation of one or more materials above the respective gate oxides associated with the voltage regions 402.

In some examples, a polysilicon material 2001 may be formed over the respective gate oxides. Additionally or alternatively, the polysilicon material may be formed over an upper surface of each dielectric material 1001 such that the upper surface of each dielectric material 1001 is in contact with a portion of the polysilicon material 2001. In some examples, the polysilicon material 2001 may have a uniform thickness across the substrate 301, however the height of the polysilicon material 2001 relative to the substrate 301 may differ above each voltage region 402 due to the thickness of respective gate oxide regions.

Figure 21:
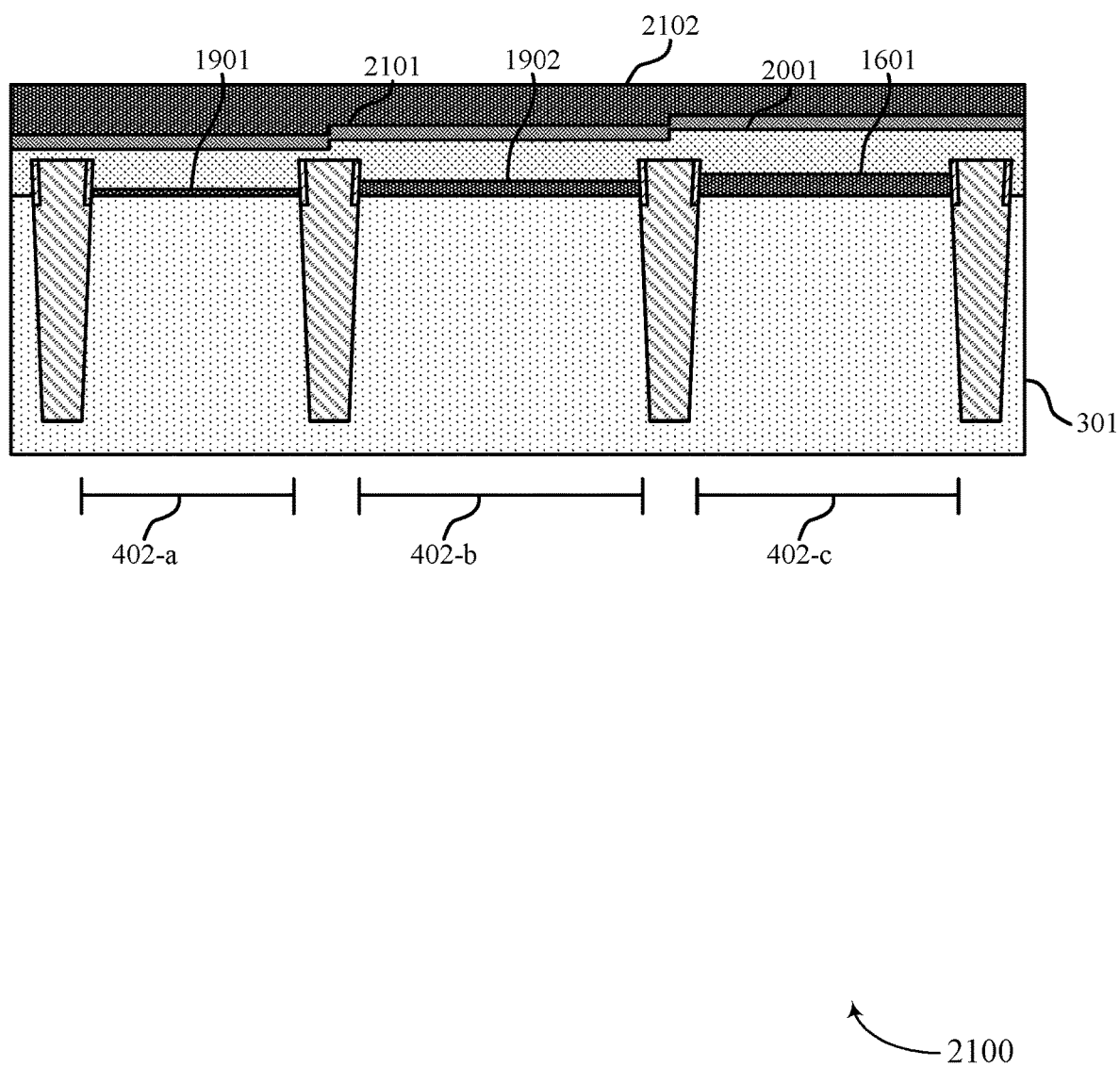

FIG. 21 illustrates an example of a process flow diagram 2100 that supports shallow trench isolation spacers in accordance with examples as disclosed herein. In some examples, the process flow diagram 2100 may illustrate the formation of one or more materials. For example, the process flow diagram 2100 may illustrate the formation of one or more materials above the polysilicon material 2001.

In some examples, a tungsten silicide material 2101 may be formed over the polysilicon material 2001. The tungsten silicide material 2101 may be formed using a sputtering operation. Additionally or alternatively, an oxide material 2102 may be formed above the tungsten silicide material 2101. In some examples, the tungsten silicide material 2101 and the oxide material 2102 may each have a uniform thickness across the substrate 301, however the height of the respective materials relative to the substrate 301 may differ above each voltage region 402 due to the thickness of respective gate oxide regions.

Figure 22:
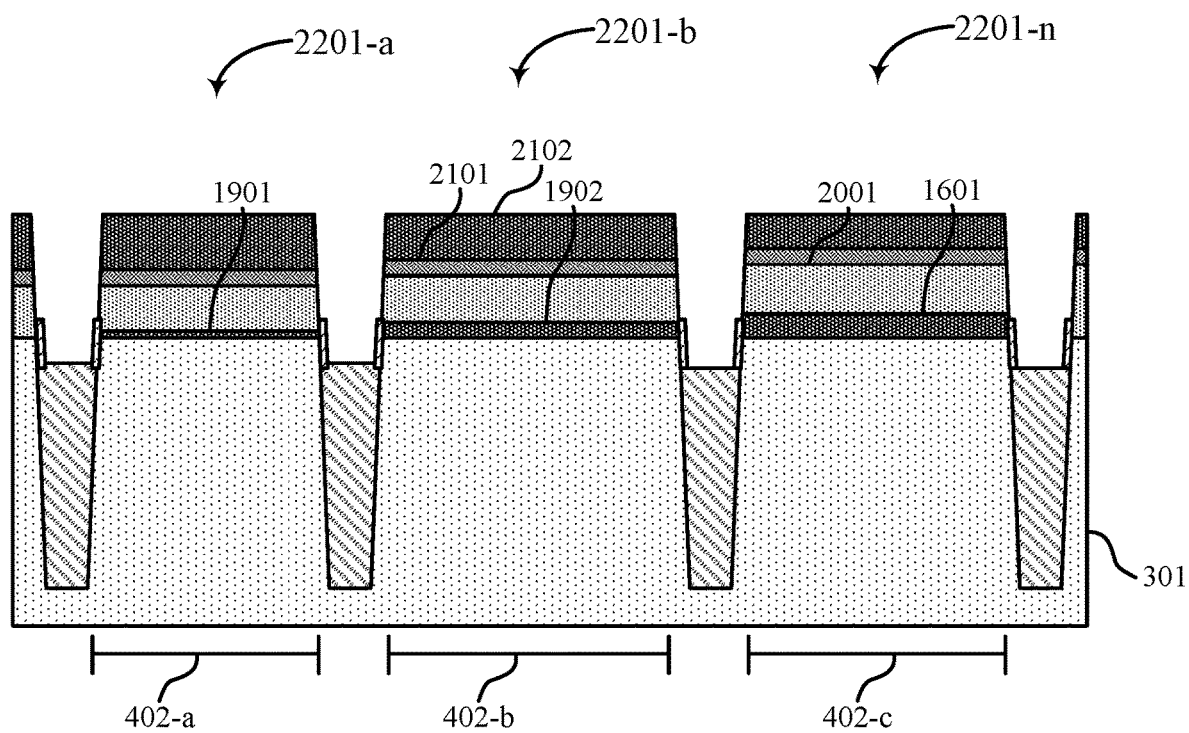

FIG. 22 illustrates an example of a process flow diagram 2200 that supports shallow trench isolation spacers in accordance with examples as disclosed herein. In some examples, the process flow diagram 2200 may illustrate the formation of one or more gate regions 2201 by performing one or more etching operations (e.g., one or more wet etching operations or one or more dry etching operations). For example, the process flow diagram 2200 may illustrate the removal of respective portions of the polysilicon material 2001, the tungsten silicide material 2101, and the oxide material 2102 above the respective voltage regions 402. In some examples, the gate regions 2201 (e.g., gate regions 2201-a, 2201-b, and 2201-n) may support the formation of one or more transistors during a subsequent processing step. Additionally or alternatively, after forming the gate regions 2201, the spacers may remain in the resulting structure. As described herein, the presence of the spacer(s) may prevent the formation of divots in the shallow trenches, thus mitigating any potential breakdown in various regions of the silicon.

Figure 23:
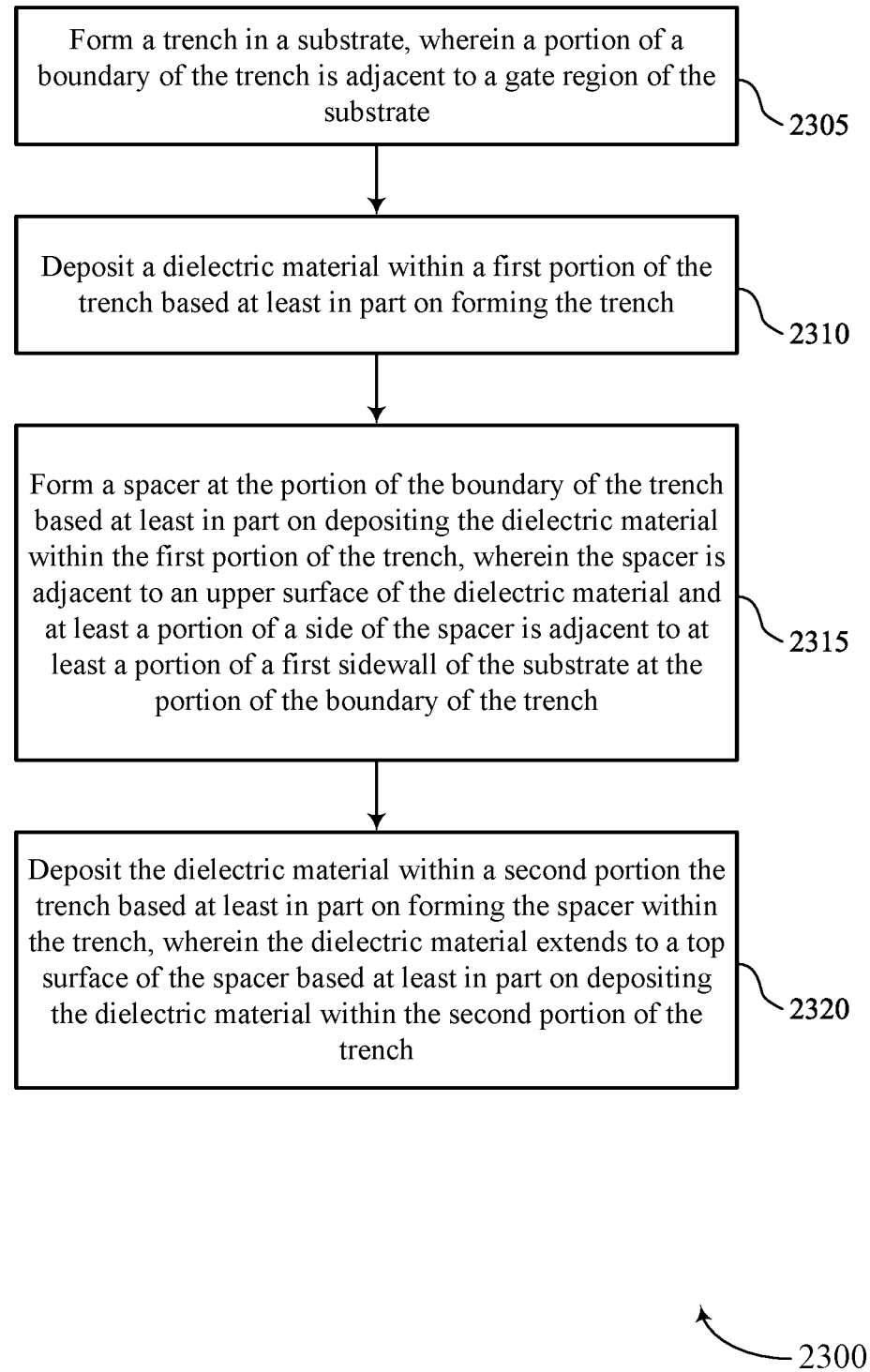
FIGS. 23 and 24 show flowcharts illustrating a method or methods that support shallow trench isolation spacers in accordance with examples as disclosed herein.

FIG. 23 shows a flowchart illustrating a method or methods 2300 that support shallow trench isolation spacers in accordance with examples as disclosed herein. The operations of method 2300 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 2305, the method may include forming a trench in a substrate, where a portion of a boundary of the trench is adjacent to a gate region of the substrate. The operations of 2305 may be performed in accordance with examples as described herein.

At 2310, the method may include forming a dielectric material within a first portion of the trench based at least in part on forming the trench. The operations of 2310 may be performed in accordance with examples as disclosed herein.

At 2315, the method may include forming a spacer at the portion of the boundary of the trench based at least in part on forming the dielectric material within the first portion of the trench, where the spacer is adjacent to an upper surface of the dielectric material and at least a portion of a side of the spacer is adjacent to at least a portion of a first sidewall of the substrate at the portion of the boundary of the trench. The operations of 2315 may be performed in accordance with examples as disclosed herein.

At 2320, the method may include forming the dielectric material within a second portion the trench based at least in part on forming the spacer within the trench, where the dielectric material extends to a top surface of the spacer based at least in part on forming the dielectric material within the second portion of the trench. The operations of 2320 may be performed in accordance with examples as disclosed herein.

In some examples, an apparatus as described herein may perform a method or methods, such as the method 2300. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming a trench in a substrate, where a portion of a boundary of the trench is adjacent to a gate region of the substrate; forming a dielectric material within a first portion of the trench based at least in part on forming the trench; forming a spacer at the portion of the boundary of the trench based at least in part on forming the dielectric material within the first portion of the trench, where the spacer is adjacent to an upper surface of the dielectric material and at least a portion of a side of the spacer is adjacent to at least a portion of a first sidewall of the substrate at the portion of the boundary of the trench; and forming the dielectric material within a second portion the trench based at least in part on forming the spacer within the trench, where the dielectric material extends to a top surface of the spacer based at least in part on forming the dielectric material within the second portion of the trench.

Aspect 2: The method, apparatus, or non-transitory computer-readable medium of aspect 1, further including operations, features, circuitry, logic, means, or instructions, or any combination thereof for forming a first oxide layer above the substrate and forming a nitride layer above the first oxide layer, where the trench is formed through the first oxide layer, the nitride layer, and the substrate.

Aspect 3: The method, apparatus, or non-transitory computer-readable medium of aspect 2, further including operations, features, circuitry, logic, means, or instructions, or any combination thereof for removing the nitride layer above the first oxide layer; implanting a dopant into the gate region through the first oxide layer based at least in part on removing the nitride layer above the first oxide layer; and removing the first oxide layer based at least in part on implanting the dopant through the first oxide layer.

Aspect 4: The method, apparatus, or non-transitory computer-readable medium of aspect 3, further including operations, features, circuitry, logic, means, or instructions, or any combination thereof for forming a second oxide layer above a first portion the substrate based at least in part on removing the first oxide layer.

Aspect 5: The method, apparatus, or non-transitory computer-readable medium of aspect 4, further including operations, features, circuitry, logic, means, or instructions, or any combination thereof for forming a third oxide layer above a second gate region, where the second oxide layer includes a first thickness and the third oxide layer includes a second thickness different than the first thickness and forming a fourth oxide layer above a third gate region, where the fourth oxide layer includes a third thickness different than the first thickness and the second thickness.

Aspect 6: The method, apparatus, or non-transitory computer-readable medium of any of aspects 4 through 5, further including operations, features, circuitry, logic, means, or instructions, or any combination thereof for forming a polysilicon material above the second oxide layer; forming a conductive material above the polysilicon material; forming a fourth oxide layer above the conductive material; and performing a first etching operation after forming the fourth oxide layer above the conductive material, where at least a portion of the fourth oxide layer, the conductive material and the polysilicon material are removed based at least in part on performing the first etching operation.

Aspect 7: The method, apparatus, or non-transitory computer-readable medium of any of aspects 2 through 6 where forming the spacer includes operations, features, circuitry, logic, means, or instructions, or any combination thereof for forming an insulating material above the dielectric material and above the nitride layer, where a first portion of the insulating material is in contact with an upper surface of the nitride layer, a second portion of the insulating material is in contact with the upper surface of the dielectric material, a third portion of the insulating material is in contact with a sidewall of the portion of the boundary of the trench and performing a second etching operation based at least in part on forming the insulating material, where the first portion of the insulating material and the second portion of the insulating material are removed based at least in part on performing the second etching operation.

Aspect 8: The method, apparatus, or non-transitory computer-readable medium of any of aspects 2 through 7, further including operations, features, circuitry, logic, means, or instructions, or any combination thereof for forming a carbon layer above the nitride layer; forming an anti-reflection layer above the carbon layer; and removing the carbon layer and the anti-reflection layer.

Aspect 9: The method, apparatus, or non-transitory computer-readable medium of any of aspects 2 through 8, further including operations, features, circuitry, logic, means, or instructions, or any combination thereof for forming an oxide liner within the trench, where the oxide liner is in contact with at least the first sidewall of the substrate, a second sidewall of the substrate, the first oxide layer, and the nitride layer, and where the dielectric material is in contact with the oxide liner.

Aspect 10: The method, apparatus, or non-transitory computer-readable medium of any of aspects 1 through 9, further including operations, features, circuitry, logic, means, or instructions, or any combination thereof for performing a third etching operation based at least in part on the dielectric material formed within the first portion of the trench, where forming the spacer within the trench is based at least in part on performing the third etching operation.

Aspect 11: The method, apparatus, or non-transitory computer-readable medium of any of aspects 1 through 10, further including operations, features, circuitry, logic, means, or instructions, or any combination thereof for forming a plurality of trenches in the substrate; forming the dielectric material within the first portion of each trench of the plurality of trenches; forming a respective spacer within each trench of the plurality of trenches; and forming the dielectric material within a second portion of each trench of the plurality of trenches.

Figure 24:
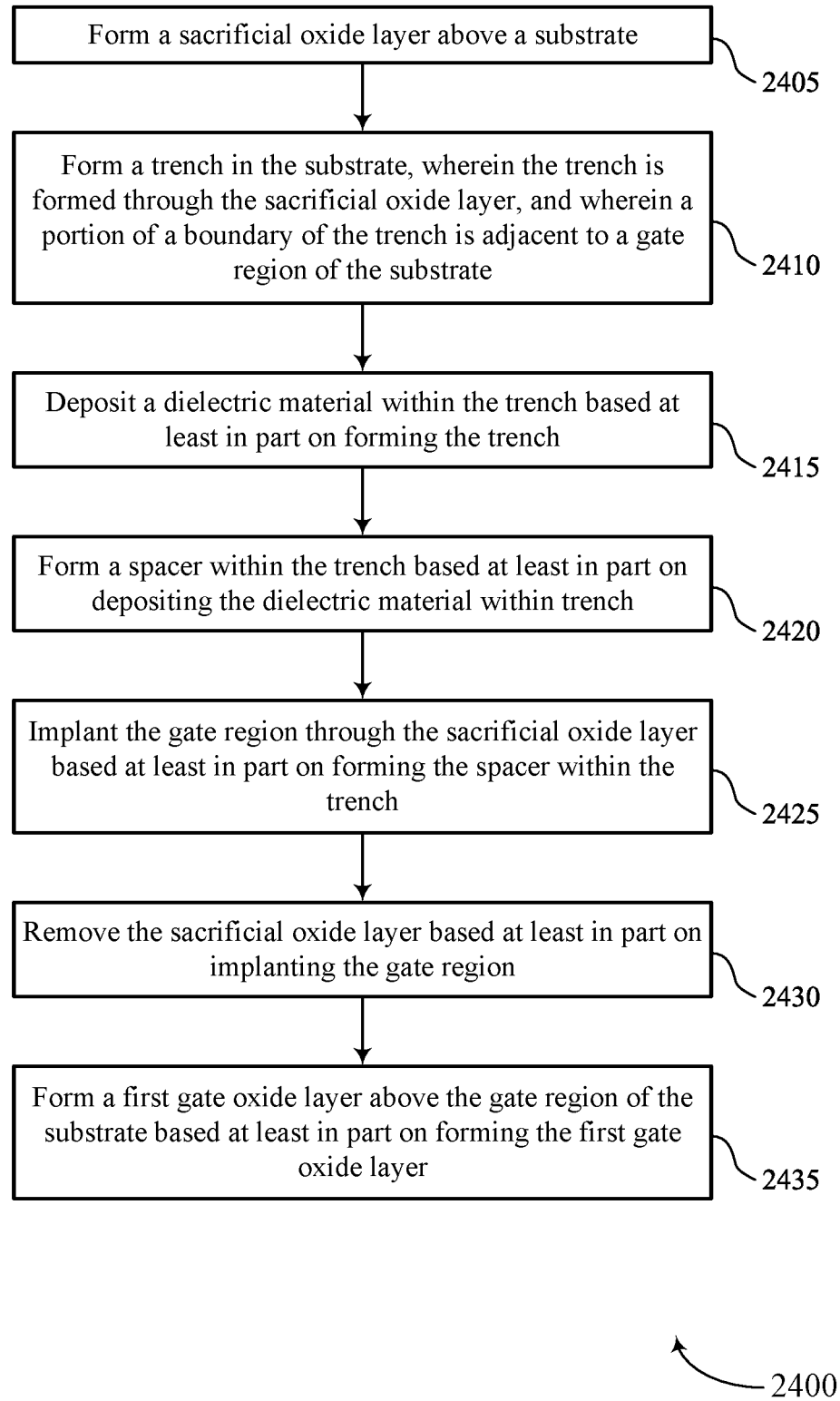

FIG. 24 shows a flowchart illustrating a method or methods 2400 that supports shallow trench isolation spacers in accordance with examples as disclosed herein. The operations of method 2400 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware.

At 2405, the method may include forming a sacrificial oxide layer above a substrate. The operations of 2405 may be performed in accordance with examples as disclosed herein.

At 2410, the method may include forming a trench in the substrate, where the trench is formed through the sacrificial oxide layer, and where a portion of a boundary of the trench is adjacent to a gate region of the substrate. The operations of 2410 may be performed in accordance with examples as disclosed herein.

At 2415, the method may include forming a dielectric material within the trench based at least in part on forming the trench. The operations of 2415 may be performed in accordance with examples as disclosed herein.

At 2420, the method may include forming a spacer within the trench based at least in part on forming the dielectric material within trench. The operations of 2420 may be performed in accordance with examples as disclosed herein.

At 2425, the method may include implanting the gate region through the sacrificial oxide layer based at least in part on forming the spacer within the trench. The operations of 2425 may be performed in accordance with examples as disclosed herein.

At 2430, the method may include removing the sacrificial oxide layer based at least in part on implanting the gate region. The operations of 2430 may be performed in accordance with examples as disclosed herein.

At 2435, the method may include forming a first gate oxide layer above the gate region of the substrate based at least in part on forming the first gate oxide layer. The operations of 2435 may be performed in accordance with examples as disclosed herein.

In some examples, an apparatus as described herein may perform a method or methods, such as the method 2400. The apparatus may include features, circuitry, logic, means, or instructions (e.g., a non-transitory computer-readable medium storing instructions executable by a processor), or any combination thereof for performing the following aspects of the present disclosure:

Aspect 12: A method, apparatus, or non-transitory computer-readable medium including operations, features, circuitry, logic, means, or instructions, or any combination thereof for forming a sacrificial oxide layer above a substrate; forming a trench in the substrate, where the trench is formed through the sacrificial oxide layer, and where a portion of a boundary of the trench is adjacent to a gate region of the substrate; forming a dielectric material within the trench based at least in part on forming the trench; forming a spacer within the trench based at least in part on forming the dielectric material within trench; implanting the gate region through the sacrificial oxide layer based at least in part on forming the spacer within the trench; removing the sacrificial oxide layer based at least in part on implanting the gate region; and forming a first gate oxide layer above the gate region of the substrate based at least in part on forming the first gate oxide layer.

Aspect 13: The method, apparatus, or non-transitory computer-readable medium of aspect 12, further including operations, features, circuitry, logic, means, or instructions, or any combination thereof for forming a second gate oxide layer above a second gate region of the substrate based at least in part on forming the first gate oxide layer above the gate region of the substrate, where the first gate oxide layer includes a first thickness and the second gate oxide layer includes a second thickness different than the first thickness and forming a third gate oxide layer above a third gate region of the substrate based at least in part on forming the second gate oxide layer above the second gate region of the substrate, where the third gate oxide layer includes a third thickness different than the first thickness and the second thickness.

Aspect 14: The method, apparatus, or non-transitory computer-readable medium of aspect 13 where forming the third gate oxide layer includes operations, features, circuitry, logic, means, or instructions, or any combination thereof for oxidizing, for a first duration, a first portion of an upper surface of the substrate.

Aspect 15: The method, apparatus, or non-transitory computer-readable medium of any of aspects 13 through 14 where forming the second gate oxide layer includes operations, features, circuitry, logic, means, or instructions, or any combination thereof for oxidizing, for a second duration greater than a first duration, a second portion of an upper surface of the substrate.

Aspect 16: The method, apparatus, or non-transitory computer-readable medium of any of aspects 12 through 15 where forming the first gate oxide layer includes operations, features, circuitry, logic, means, or instructions, or any combination thereof for oxidizing, for a third duration greater than a first duration and a second duration, a third portion of an upper surface of the substrate.

Aspect 17: The method, apparatus, or non-transitory computer-readable medium of any of aspects 12 through 16, further including operations, features, circuitry, logic, means, or instructions, or any combination thereof for forming a polysilicon material above the first gate oxide layer; forming a tungsten silicide material above the polysilicon material; forming an oxide layer above the tungsten silicide material; and performing a first etching operation after forming the oxide layer above the tungsten silicide material, where at least a portion of the oxide layer, the tungsten silicide material, and the polysilicon material are removed based at least in part on performing the first etching operation.

Aspect 18: The method, apparatus, or non-transitory computer-readable medium of any of aspects 12 through 17, further including operations, features, circuitry, logic, means, or instructions, or any combination thereof for forming a nitride layer above the sacrificial oxide layer, where forming the spacer includes; forming an insulating material above at least a portion of the dielectric material and above the nitride layer; and performing a second etching operation based at least in part on forming the insulating material above at least the portion of the dielectric material and above the nitride layer, where at least the insulating material above the nitride layer is removed based at least in part on performing the second etching operation.

Aspect 19: The method, apparatus, or non-transitory computer-readable medium of aspect 18, further including operations, features, circuitry, logic, means, or instructions, or any combination thereof for forming the dielectric material within the trench for a second time based at least in part on performing the second etching operation.

Aspect 20: The method, apparatus, or non-transitory computer-readable medium of any of aspects 18 through 19, further including operations, features, circuitry, logic, means, or instructions, or any combination thereof for forming an oxide liner within the trench, where the oxide liner is in contact with at least a first sidewall of the substrate, a second sidewall of the substrate, the sacrificial oxide layer, and the nitride layer, and where the dielectric material is in contact with the oxide liner.

Aspect 21: The method, apparatus, or non-transitory computer-readable medium of any of aspects 18 through 20, further including operations, features, circuitry, logic, means, or instructions, or any combination thereof for forming a carbon layer above the nitride layer; forming an anti-reflection layer above the carbon layer; and removing the carbon layer and the anti-reflection layer.

It should be noted that the described methods include possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 22: An apparatus, including: a substrate including a trench region, where the trench region includes a dielectric material; a spacer located within the trench region, where the spacer extends along a sidewall of the trench region and is adjacent to a first gate region of the substrate; a first oxide material above the first gate region of the substrate, where the first oxide material includes a first thickness and is in contact with at least a portion of the spacer; a second oxide material above a second gate region of the substrate, where the second oxide material includes a second thickness and is in contact with at least a portion of the spacer; a third oxide material above a third gate region of the substrate, where the third oxide material includes a third thickness and is in contact with at least a portion of the spacer; and a polysilicon material located above the first oxide material and the second oxide material, where at least a portion of the polysilicon material is in contact with a top surface of the dielectric material of the trench region.

Aspect 23: The apparatus of aspect 22, further including: a tungsten silicide material located above the polysilicon material; and a third oxide material located above the tungsten silicide material.

Aspect 24: The apparatus of any of aspects 22 through 23, where the first gate region is associated with a first voltage threshold and the second gate region is associated with a second voltage threshold different than the first voltage threshold.

Aspect 25: The apparatus of any of aspects 22 through 24, where a first surface area of a first side of the spacer is in contact with the first oxide material, and a second surface area of a second side of the spacer is in contact with the second oxide material, the first surface area is different than the second surface area.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials, or combinations thereof. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally, or alternatively (e.g., in an alternative example), be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a digital signal processor (DSP), an application-specific integrated circuit (ASIC), a field-programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   forming a trench in a substrate, wherein a portion of a boundary of the trench is adjacent to a gate region of the substrate;
   forming a dielectric material within a first portion of the trench based at least in part on forming the trench;
   forming a spacer at the portion of the boundary of the trench based at least in part on forming the dielectric material within the first portion of the trench, wherein the spacer is adjacent to an upper surface of the dielectric material, at least a first portion of a side of the spacer is adjacent to at least a portion of a first sidewall of the substrate at the portion of the boundary of the trench, and at least a second portion of the side of the spacer is exposed after forming the spacer; and
   forming the dielectric material within a second portion of the trench based at least in part on forming the spacer within the trench, wherein the dielectric material extends to a top surface of the spacer based at least in part on forming the dielectric material within the second portion of the trench.

2. The method of claim 1, further comprising:
   forming a first oxide layer above the substrate; and
   forming a nitride layer above the first oxide layer, wherein the trench is formed through the first oxide layer, the nitride layer, and the substrate.

3. The method of claim 2, further comprising:
   removing the nitride layer above the first oxide layer, wherein the second portion of the side of the spacer is exposed based on removing the nitride layer;
   implanting a dopant into the gate region through the first oxide layer based at least in part on removing the nitride layer above the first oxide layer; and
   removing the first oxide layer based at least in part on implanting the dopant through the first oxide layer.

4. The method of claim 3, further comprising:
   forming a second oxide layer above a first portion of the substrate based at least in part on removing the first oxide layer.

5. The method of claim 4, further comprising:
   forming a third oxide layer above a second gate region, wherein the second oxide layer comprises a first thickness and the third oxide layer comprises a second thickness different than the first thickness; and
   forming a fourth oxide layer above a third gate region, wherein the fourth oxide layer comprises a third thickness different than the first thickness and the second thickness.

6. The method of claim 4, further comprising:
   forming a polysilicon material above the second oxide layer;
   forming a conductive material above the polysilicon material;
   forming a fourth oxide layer above the conductive material; and
   performing a first etching operation after forming the fourth oxide layer above the conductive material, wherein at least a portion of the fourth oxide layer, the conductive material and the polysilicon material are removed based at least in part on performing the first etching operation.

7. The method of claim 2, wherein forming the spacer comprises:

forming an insulating material above the dielectric material and above the nitride layer, wherein a first portion of the insulating material is in contact with an upper surface of the nitride layer, a second portion of the insulating material is in contact with the upper surface of the dielectric material, a third portion of the insulating material is in contact with a sidewall of the portion of the boundary of the trench; and performing a second etching operation based at least in part on forming the insulating material, wherein the first portion of the insulating material and the second portion of the insulating material are removed based at least in part on performing the second etching operation.

8. The method of claim 2, further comprising:
forming a carbon layer above the nitride layer;
forming an anti-reflection layer above the carbon layer; and
removing the carbon layer and the anti-reflection layer.

9. The method of claim 2, further comprising:
forming an oxide liner within the trench, wherein the oxide liner is in contact with at least the first sidewall of the substrate, a second sidewall of the substrate, the first oxide layer, and the nitride layer, and wherein the dielectric material is in contact with the oxide liner.

10. The method of claim 1, further comprising:
performing a third etching operation based at least in part on the dielectric material formed within the first portion of the trench, wherein forming the spacer within the trench is based at least in part on performing the third etching operation.

11. The method of claim 1, further comprising:
forming a plurality of trenches in the substrate;
forming the dielectric material within the first portion of each trench of the plurality of trenches;
forming a respective spacer within each trench of the plurality of trenches; and
forming the dielectric material within a second portion of each trench of the plurality of trenches.

12. A method, comprising:
forming a sacrificial oxide layer above a substrate;
forming a trench in the substrate, wherein the trench is formed through the sacrificial oxide layer, and wherein a portion of a boundary of the trench is adjacent to a gate region of the substrate;
forming a dielectric material within the trench based at least in part on forming the trench;
forming a spacer within the trench based at least in part on forming the dielectric material within trench;
implanting the gate region through the sacrificial oxide layer based at least in part on forming the spacer within the trench;
removing the sacrificial oxide layer based at least in part on implanting the gate region; and
forming a first gate oxide layer above the gate region of the substrate based at least in part on forming the first gate oxide layer.

13. The method of claim 12, further comprising:
forming a second gate oxide layer above a second gate region of the substrate based at least in part on forming the first gate oxide layer above the gate region of the substrate, wherein the first gate oxide layer comprises a first thickness and the second gate oxide layer comprises a second thickness different than the first thickness; and forming a third gate oxide layer above a third gate region of the substrate based at least in part on forming the second gate oxide layer above the second gate region of the substrate, wherein the third gate oxide layer comprises a third thickness different than the first thickness and the second thickness.

14. The method of claim 13, wherein forming the third gate oxide layer comprises:
oxidizing, for a first duration, a first portion of an upper surface of the substrate.

15. The method of claim 13, wherein forming the second gate oxide layer comprises:
oxidizing, for a second duration greater than a first duration, a second portion of an upper surface of the substrate.

16. The method of claim 12, wherein forming the first gate oxide layer comprises:
oxidizing, for a third duration greater than a first duration and a second duration, a third portion of an upper surface of the substrate.

17. The method of claim 12, further comprising:
forming a polysilicon material above the first gate oxide layer;
forming a tungsten silicide material above the polysilicon material;
forming an oxide layer above the tungsten silicide material; and
performing a first etching operation after forming the oxide layer above the tungsten silicide material, wherein at least a portion of the oxide layer, the tungsten silicide material, and the polysilicon material are removed based at least in part on performing the first etching operation.

18. The method of claim 12, further comprising:
forming a nitride layer above the sacrificial oxide layer, wherein forming the spacer comprises:
forming an insulating material above at least a portion of the dielectric material and above the nitride layer; and
performing a second etching operation based at least in part on forming the insulating material above at least the portion of the dielectric material and above the nitride layer, wherein at least the insulating material above the nitride layer is removed based at least in part on performing the second etching operation.

19. The method of claim 18, further comprising:
forming the dielectric material within the trench for a second time based at least in part on performing the second etching operation.

20. The method of claim 18, further comprising:
forming an oxide liner within the trench, wherein the oxide liner is in contact with at least a first sidewall of the substrate, a second sidewall of the substrate, the sacrificial oxide layer, and the nitride layer, and wherein the dielectric material is in contact with the oxide liner.

21. The method of claim 18, further comprising:
forming a carbon layer above the nitride layer;
forming an anti-reflection layer above the carbon layer; and
removing the carbon layer and the anti-reflection layer.

* * * * *